US006366404B1

United States Patent
Hiraiwa et al.

(10) Patent No.: US 6,366,404 B1
(45) Date of Patent: Apr. 2, 2002

(54) PROJECTION OPTICAL SYSTEM, PRODUCTION METHOD THEREOF, AND PROJECTION EXPOSURE APPARATUS USING IT

(75) Inventors: Hiroyuki Hiraiwa; Issey Tanaka, both of Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/654,269

(22) Filed: Sep. 1, 2000

Related U.S. Application Data

(63) Continuation-in-part of application No. PCT/JP00/00027, filed on Jan. 6, 2000.

(30) Foreign Application Priority Data

Jan. 6, 1999 (JP) .......................................... 11-001416

(51) Int. Cl.[7] .............................................. G02B 26/08
(52) U.S. Cl. ...................... 359/494; 359/350; 359/355; 359/499; 355/67; 501/54
(58) Field of Search ................................ 359/350, 352, 359/355, 494, 499; 250/492.2; 355/67; 399/218; 428/426; 501/53, 54, 905

(56) References Cited

U.S. PATENT DOCUMENTS

| | | | | |
|---|---|---|---|---|
| 5,325,230 A | * | 6/1994 | Yamagata et al. | 359/350 |
| 5,719,698 A | * | 2/1998 | Hiraiwa et al. | 359/355 |
| 6,087,283 A | * | 7/2000 | Jinbo et al. | 359/350 |

FOREIGN PATENT DOCUMENTS

| | | |
|---|---|---|
| JP | 8-005801 | 1/1996 |
| JP | 8-107060 | 4/1996 |
| JP | 11-054411 | 2/1999 |
| WO | WO 98/00761 | 1/1998 |

\* cited by examiner

*Primary Examiner*—Darren Schuberg
(74) *Attorney, Agent, or Firm*—Oliff & Berridge, PLC

(57) ABSTRACT

In a projection optical system having at least two silica glass optical members, a birefringence value is measured at each of points in a plane normal to the optical axis with the center at an intersection of each optical member with the optical axis, a distribution of signed birefringence values in each optical member is obtained by assigning a positive sign to each birefringence value when a direction of the fast axis thereof is a radial direction to the intersection with the optical axis and assigning a negative sign to each birefringence value when the direction of the fast axis thereof is normal to the radial direction, and the optical members are combined with each other so as to satisfy such a placement condition that a signed birefringence characteristic value of the entire projection optical system calculated based on the distributions of signed birefringence values is between −0.5 and +0.5 nm/cm both inclusive. This permits minimization of influence from nonuniform distribution of birefringence values in the optical members on the imaging performance of the projection optical system or on the resolution of projection exposure apparatus and in turn enables provision of the projection optical system with high imaging performance, a production method thereof, and the projection exposure apparatus capable of achieving high resolution.

18 Claims, 16 Drawing Sheets

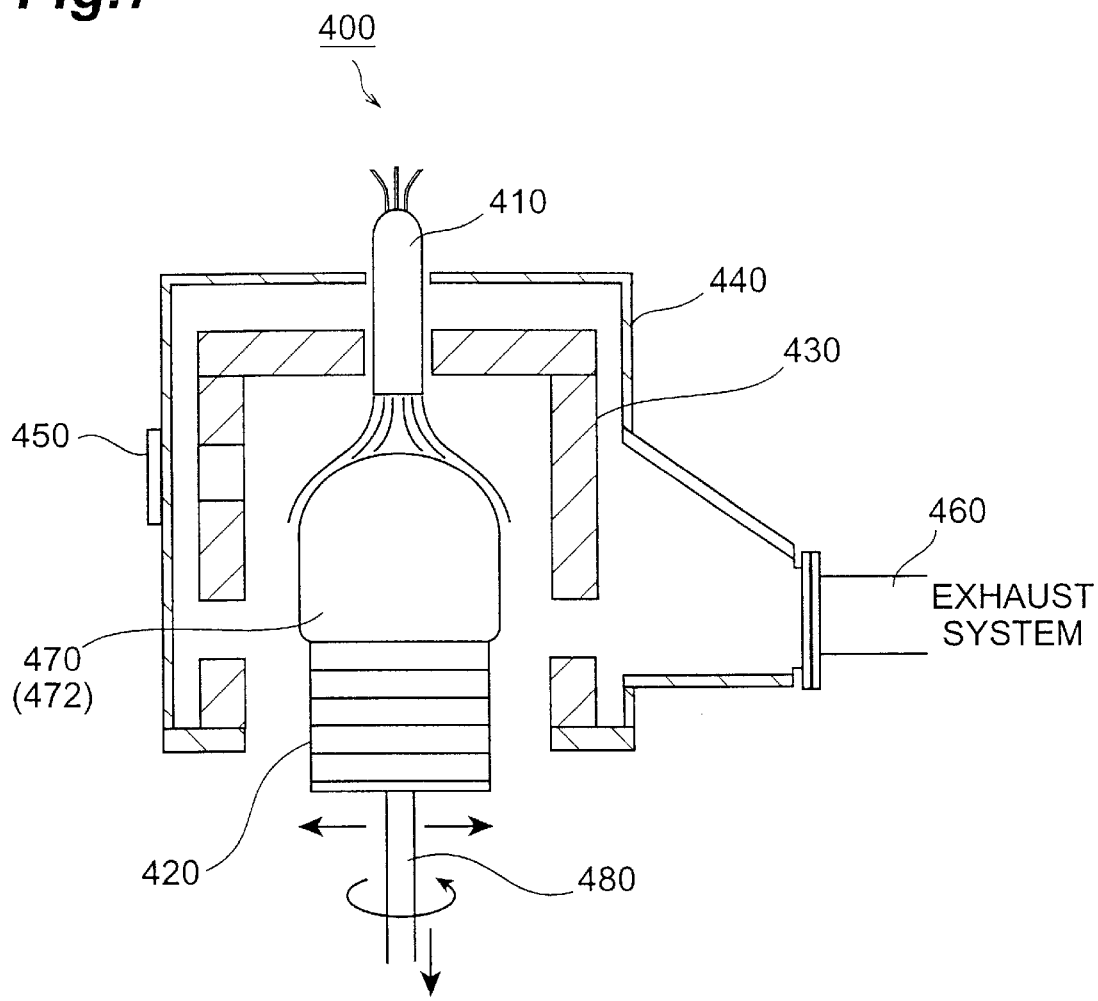

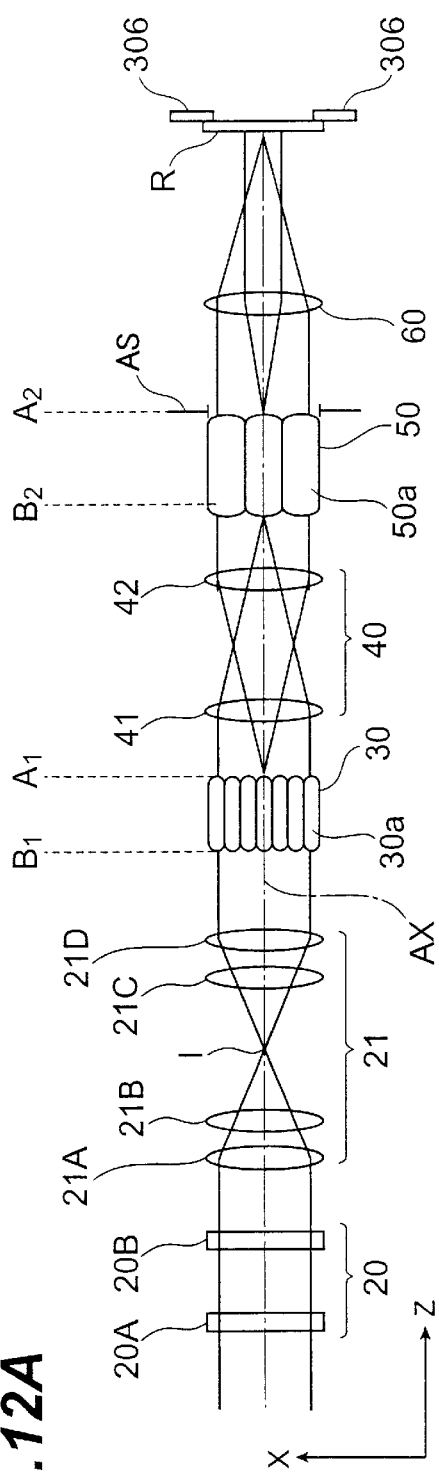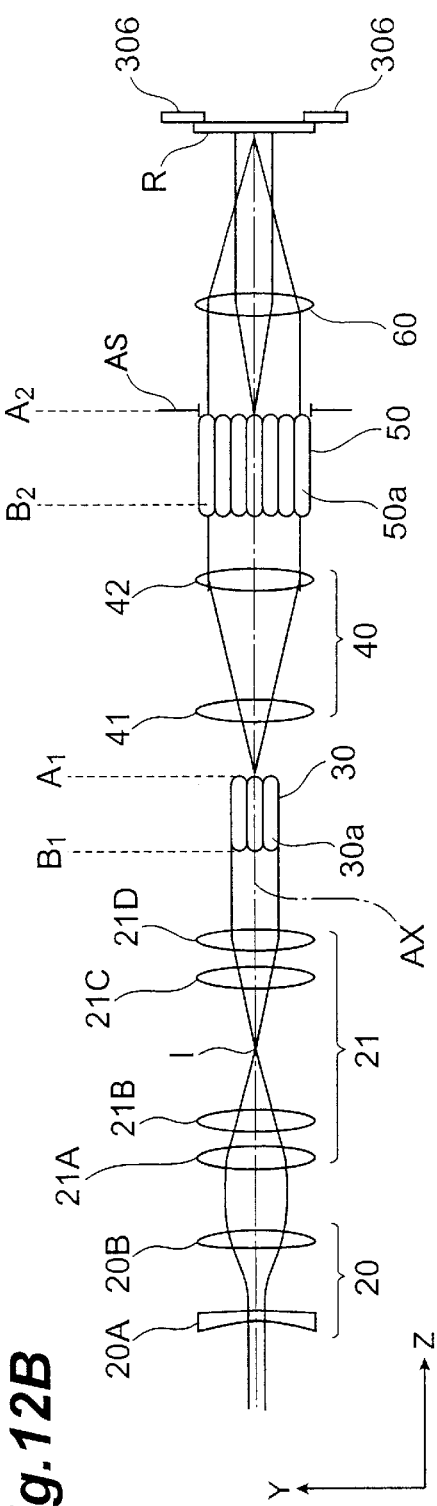

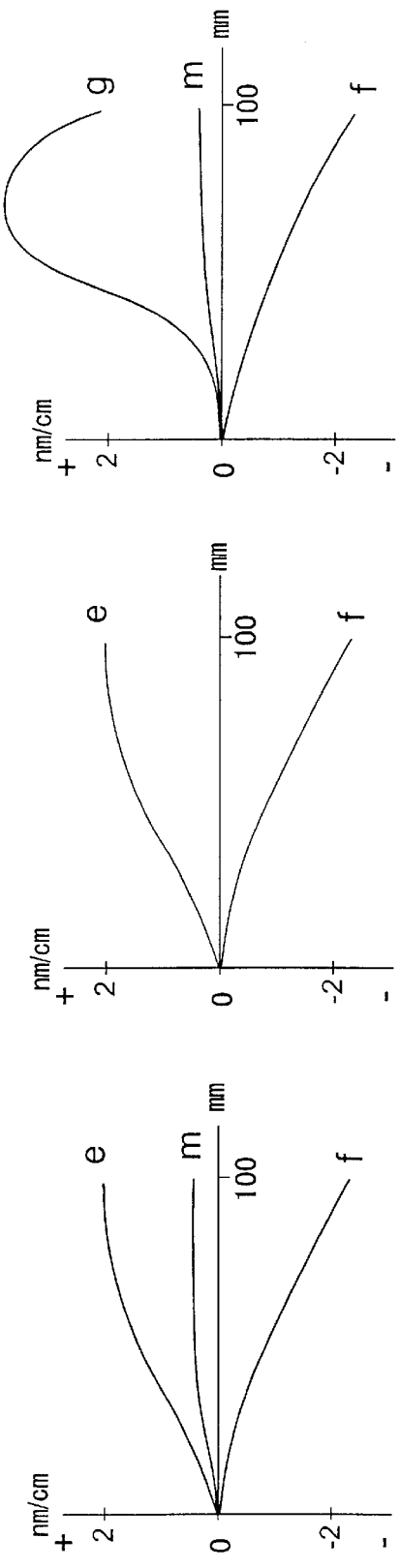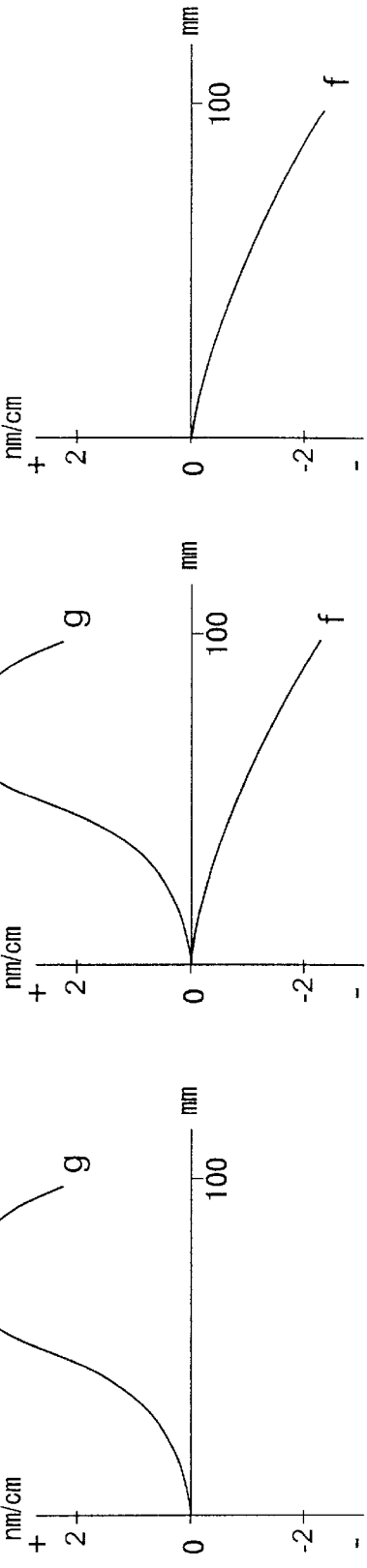

PROJECTION OPTICAL SYSTEM, PRODUCTION METHOD THEREOF, AND PROJECTION EXPOSURE APPARATUS USING IT

RELATED APPLICATIONS

This is a Continuation-In-Part application of International Patent Application serial No. PCT/JP00/00027 filed on Jan. 6, 2000, now pending.

BACKGROUND OF THE INVENTION

1. Field of the Invention

The present invention relates to a projection optical system, a production method thereof, and a projection exposure apparatus using it. More particularly, the invention concerns a projection optical system used for transferring a predetermined mask pattern onto a substrate by use of a light source of an ultraviolet region suitable for semiconductor fabrication, a production method thereof, and a projection exposure apparatus using it.

2. Related Background Art

An example of the conventional projection exposure apparatus for semiconductor fabrication is one having the structure as illustrated in FIG. 16A and FIG. 16B.

Specifically, the projection exposure apparatus 800 illustrated in FIG. 16A is constructed in such structure that rays from a light source 501 such as a mercury-arc lamp or the like are collected by an ellipsoidal mirror 502 and that thereafter they are converted into a bundle of parallel rays by a collimator lens 503. Then this parallel beam travels through a fly's eye lens 504, which is an aggregate of optical elements 504a of a square section as illustrated in FIG. 16B, to form a plurality of light source images on the exit side thereof. An aperture stop 505 having a circular aperture is disposed at the position of the light source images. Beams from the plurality of light source images are condensed by a condenser lens 506 to uniformly illuminate a reticle R as an object to be illuminated, in superimposed fashion.

A pattern on the reticle R kept under uniform illumination by the illumination optical system in this way is projected onto a wafer W coated with a resist, by a projection optical system 507 consisting of a plurality of lenses. This wafer W is mounted on a wafer stage WS, which is arranged to move two-dimensionally, and the projection exposure apparatus 800 of FIG. 16A is designed to perform exposure by the so-called step-and-repeat method in which the wafer stage is successively moved two-dimensionally in order to implement exposure in a next shot area after completion of exposure in one shot area on the wafer.

In recent years proposals have been made about such scanning exposure methods that a rectangular or arcuate beam was radiated onto the reticle R and that the reticle R and wafer W located in conjugate with each other with respect to the projection optical system 507 were moved in a fixed direction whereby the pattern of the reticle R could be transferred in high throughput onto the wafer W.

In the projection exposure apparatus in either of the above methods, it is desirable that optical members used in their optical systems have high transmittance at the wavelength of the light source used. The reason is as follows: the optical systems of the projection exposure apparatus are constructed of a combination of many optical members; even if optical loss per lens is little the total transmittance will be decreased greatly when the optical loss is added up by the number of optical members used. If an optical member inferior in transmittance were used, it would absorb the exposure light to increase the temperature of the optical member itself and thus cause heterogeneity of refractive index and, in turn, local thermal expansion of the optical member would deform polished surfaces. This would degrade the optical performance.

On the other hand, the projection optical systems are required to have high homogeneity of refractive index of the optical members in order to achieve a finer and sharper projection exposure pattern. The reason is that variations in refractive index will cause a lead and a lag of light and this will greatly affect the imaging performance of the projection optical system.

Thus silica glass or calcium fluoride crystals high in transmittance in the ultraviolet region and excellent in homogeneity are generally used as materials for the optical members used in the optical systems of the projection exposure apparatus in the ultraviolet region (not more than the wavelength of 400 nm).

Proposals of decreasing the wavelength of the light source have been made recently in order to transfer a finer mask pattern image onto the wafer surface, that is, in order to enhance the resolution. For example, decrease of wavelength into a shorter range is under way from the g-line (436 nm) and the i-line (365 nm), which have been used heretofore, to KrF (248 nm) and ArF (193 nm) excimer lasers.

In the projection exposure using such shorter-wavelength excimer lasers, since the purpose is to obtain the finer mask pattern, the materials used are those with higher performance as to the homogeneity of transmittance and refractive index.

SUMMARY OF THE INVENTION

With use of such materials having the high homogeneity of transmittance and refractive index, however, there were cases wherein desired resolution was not obtained after the optical system was assembled in combination of plural materials.

An object of the present invention is, therefore, to provide a projection optical system having high imaging performance, a production method thereof, and a projection exposure apparatus capable of achieving high resolution.

The inventors have conducted intensive and extensive research in order to accomplish the above object and first found out that birefringence of the materials of the optical members greatly affected the imaging performance of the projection optical system and the resolution of the projection exposure apparatus. Then the inventors discovered that the imaging performance close to designed performance of the projection optical system and the resolution close to designed performance of the projection exposure apparatus were attained if the magnitude of birefringence, i.e., birefringence values (absolute values) of the materials of the optical members were not more than 2 nm/cm and if distribution of birefringence was symmetric with respect to the center in the optical members, and disclosed it in Japanese Patent Application Laid-Open No. 8-107060.

With increase in demands for much higher resolution of the projection exposure apparatus, however, there were cases wherein satisfactory imaging performance of the projection optical system and satisfactory resolution of the projection exposure apparatus were not attained even with employment of the above conventional design concept if light of the shorter wavelength was used as a light source or if an optical member having a large diameter and a large thickness was used.

Thus the inventors have conducted further research and, as a result, discovered that the cause of failing to obtain the projection optical system and projection exposure apparatus of desired optical performance even with use of the optical members having good homogeneity of transmittance and refractive index was that distribution states of birefringence of the optical members differed among the optical members, the different birefringence distributions were added up in the overall optical system where the projection optical system was constructed in combination of a plurality of optical members, and this resulted in disturbing the wavefront of the light in the overall optical system, thereby greatly affecting the imaging performance of the projection optical system and the resolution of the projection exposure apparatus.

Describing the above in more detail, the conventional ways of evaluating the birefringence of optical members were nothing but arguments about whether the magnitude (absolute values) was high or low, and there was no concept of the above distribution of birefringence in the optical members at all, either. For example, for measuring the birefringence of a silica glass member, it was common recognition to those skilled in the art to measure the birefringence at several points near 95% of the diameter of the member and employ a maximum as a birefringence value in the member. However, the inventors precisely measured the distribution of birefringence of silica glass members and found that the actual distribution of birefringence was nonuniform.

Therefore, the inventors found out that influence of birefringence in each member was not able to be evaluated sufficiently by simply managing the maximum of birefringence values at several points in the member even if the silica glass member had high uniformity of refractive index and, particularly, that it was very difficult to obtain an optical system of desired performance in combination of plural members. The reason why such nonuniform distribution of birefringence values is formed in the silica glass member is conceivably that the nonuniform distribution of birefringence values is formed in the member during cooling of the silica glass member because of temperature distribution during synthesis, nonuniform distribution of impurities, or nonuniform distribution of structural defects of $SiO_2$.

Since the evaluation of birefringence in the overall optical system constructed of a plurality of optical members was not able to be expressed simply by only the magnitude of birefringence in the individual optical members as discussed above, the inventors precisely investigated how the nonuniform distribution of birefringence values in the optical members affected the optical system. As a result, the inventors first discovered that, with attention being focused on directions of the fast axis as to the nonuniform distribution of birefringence values, the birefringence values were added up to negatively affect the performance of the optical system when the optical system was constructed of optical members having their respective distributions of birefringence values with the same direction of the fast axis, and that negative effects due to the birefringence of the individual members canceled out in the overall optical system where optical members having different directions of the fast axis were combined conversely, and thus accomplished the present invention.

Namely, a projection optical system of the present invention is a projection optical system having at least two silica glass optical members, wherein the optical members are combined with each other so as to satisfy such a placement condition that a signed birefringence characteristic value of the entire projection optical system is between −0.5 and +0.5 nm/cm both inclusive, said signed birefringence characteristic value being calculated in such a manner that a birefringence value is measured at each of points in a plane normal to the optical axis with a center at an intersection with the optical axis in each optical member, a distribution of signed birefringence values in each optical member is obtained based on a plurality of birefringence values and directions of the fast axis thereof, and the signed birefringence characteristic value of the entire optical system is calculated based on the distributions of signed birefringence values.

When the optical members are combined so as to satisfy the above placement condition based on the signed birefringence values, the nonuniform distributions of birefringence values in the individual optical members can be quantitatively evaluated with attention on the directions of the fast axis and the optical system can be assembled while quantitatively estimating the signed birefringence characteristic value of the entire optical system from the signed birefringence values of the optical members so as to cancel the distributions of birefringence in the optical members with each other, thereby obtaining the projection optical system with good imaging performance.

A projection exposure apparatus of the present invention is a projection exposure apparatus comprising an exposure light source, a reticle in which a pattern original image is formed, an illumination optical system for illuminating the reticle with light emitted from the exposure light source, a projection optical system for projecting a pattern image outputted from the reticle, onto a photosensitive substrate, and an alignment system for achieving alignment of the photosensitive substrate with the reticle, wherein the projection optical system is the projection optical system of the present invention described above.

The provision of the projection optical system of the present invention permits the projection exposure apparatus of the present invention to attain excellent resolution.

Further, a production method of the projection optical system according to the present invention is a production method of a projection optical system having at least two silica glass optical members, the production method comprising a step of measuring a birefringence value at each of points in a plane normal to the optical axis with a center at an intersection with the optical axis in each optical member and obtaining a distribution of signed birefringence values in the plane normal to the optical axis, based on a plurality of birefringence values and directions of the fast axis thereof, a step of calculating a signed birefringence characteristic value of the entire projection optical system, based on the distributions of signed birefringence values of the respective optical members, and a step of combining the optical members with each other so as to satisfy such a placement condition that the signed birefringence characteristic value of the entire projection optical system is between −0.5 and +0.5 nm/cm both inclusive.

The concept of "signed birefringence value" in the present invention will be described below.

The signed birefringence value means a birefringence value provided with a sign in consideration of the direction of the fast axis defined in the index ellipsoid in the measurement of birefringence values of an optical member.

More specifically, in the plane normal to the optical axis with the center at the intersection between the optical member and the optical axis, an area under circular irradiation of light is defined as a nearly circular, effective section, the plus (or minus) sign is assigned to a birefringence value measured when the direction of the fast axis in a small area at a birefringence measuring point on this effective section is parallel to a radial direction from the center at the intersecting point between the optical member and the optical axis, and the minus (or plus) sign is assigned when perpendicular.

The above sign assigning method to the birefringence values can also be applied to cases wherein a plurality of beams are radiated into the plane normal to the optical axis with the center at the intersecting point between the optical member and the optical axis. In such cases, the plus (or minus) sign is assigned to a birefringence value measured when the direction of the fast axis in a small area at a birefringence measuring point on an effective section of each of the areas under illumination with the plurality of beams is parallel to a radial direction from the center at the intersection between the optical member and the optical axis, and the minus (or plus) sign is assigned when perpendicular.

Further, the above sign assigning method to the birefringence values can also be applied to cases wherein the beams have the shape other than the circular cross section in the plane normal to the optical axis with the center at the intersection between the optical member and the optical axis, for example, to cases of beams of a ring cross section or an elliptic cross section. In these cases, the plus (or minus) sign is assigned to a birefringence value measured when the direction of the fast axis in a small area at a birefringence measuring point on an effective section of each of the areas under illumination with the plurality of beams is parallel to a radial direction from the center at the intersection between the optical member and the optical axis, and the minus (or plus) sign is assigned when perpendicular.

The following will describe the cases wherein the plus sign is assigned to a birefringence value measured when the direction of the fast axis in the small area at the birefringence measuring point on the effective area under irradiation with the beam is parallel to a radial direction from the center at the intersection between the optical member and the optical axis and the minus sign is assigned when perpendicular.

The signed birefringence value will be described below in further detail with reference to FIG. 1A, FIG. 1B, FIG. 2A, FIG. 2B, FIG. 3A, and FIG. 3B.

FIG. 1A is a schematic diagram to show directions of the fast axis at birefringence measuring points $P_{11}$, $P_{12}$, $P_{13}$, and $P_{14}$ the distance $r_1$, $r_2$, $r_3$, or $r_4$, respectively, apart from the center $O_1$ on the effective section of the optical member L1. In this figure the birefringence measuring points $P_{11}$ to $P_{14}$ are positioned on a straight line $Q_1$ extending radially through the center $O_1$ for convenience's sake of description. In the figure, the size of a small area indicated by a circle at each measuring point corresponds to an optical path difference at each measuring point. Directions of segments $W_{11}$, $W_{12}$, $W_{13}$, and $W_{14}$ in these small areas indicate the directions of the fast axis. Since all the directions of the fast axis at the measuring points $P_{11}$ to $P_{14}$ are parallel to the direction of the straight line $Q_1$, i.e., to the radial direction, all the birefringence values at the measuring points $P_{11}$ to $P_{14}$ are expressed with the plus sign. When these signed birefringence values $A_{11}$, $A_{12}$, $A_{13}$, $A_{14}$ at the measuring points $P_{11}$ to $P_{14}$ illustrated in FIG. 1A, obtained as described above, are plotted against the distance in the radial direction, the distribution obtained is, for example, the profile as illustrated in FIG. 1B.

FIG. 2A is a schematic diagram to show directions of the fast axis at birefringence measuring points $P_{21}$, $P_{22}$, $P_{23}$, $P_{24}$ the distance $r_1$, $r_2$, $r_3$, or $r_4$, respectively, apart from the center $O_2$ on the effective section of the optical member L2, similar to FIG. 1A. In this case, since all the directions of the fast axis $W_{21}$, $W_{22}$, $W_{23}$, $W_{24}$ at the measuring points $P_{21}$ to $P_{24}$ are normal to the direction of the straight line $Q_2$, i.e., to the radial direction, all the signed birefringence values $A_{21}$, $A_{22}$, $A_{23}$, $A_{24}$ at the measuring points $P_{21}$ to $P_{24}$ are expressed with the minus sign. When these signed birefringence values $A_{21}$ to $A_{24}$ at the measuring points $P_{21}$ to $P_{24}$ illustrated in FIG. 2A, obtained as described above, are plotted against the distance in the radial direction, the distribution obtained is, for example, the profile as illustrated in FIG. 2B.

FIG. 3A is a schematic diagram to show directions of the fast axis at birefringence measuring points $P_{31}$, $P_{32}$, $P_{33}$, $P_{34}$, and $P_{35}$ the distance $r_1$, $r_2$, $r_3$, $r_4$, or $r_5$, respectively, apart from the center $O_3$ on the effective section of the optical member L3, similar to FIG. 1A. In this case, the directions of the fast axis $W_{31}$, $W_{32}$, $W_{33}$, $W_{34}$, and $W_{35}$ at the measuring points $P_{31}$ to $P_{35}$ are such that those at the measuring points $P_{31}$ to $P_{33}$ are parallel to the direction of the straight line $Q_3$, i.e., to the radial direction and those at the measuring points $P_{34}$, $P_{35}$ are perpendicular to the radial direction, and thus the distribution of the signed birefringence values $A_{31}$ to $A_{35}$ at the measuring points $P_{31}$ to $P_{35}$ against the distance in the radial direction is the profile as illustrated in FIG. 3B.

Next, the "signed birefringence characteristic value of the entire projection optical system" in the present invention will be described below based on FIG. 4A and FIG. 4B.

FIG. 4A is a schematic side view in which m optical members constituting the projection optical system are arranged in order from the light source. FIG. 4B is a schematic, cross-sectional view to show the effective section normal to the optical axis, of the optical member Li located at the ith position from the light source out of the m optical members illustrated in FIG. 4A.

In the present invention, it is assumed that the distribution of birefringence values in the optical member is uniform in the direction of the thickness of the member parallel to the optical-axis direction but nonuniform in the radial direction on the effective section normal to the optical axis. Here the "effective section" means an area under irradiation of light in the plane normal to the optical axis of the optical member. An intersection of the effective section with the optical axis is defined as a center of the effective section and the radius thereof as an effective radius of the effective section of the optical member. In the measurement of the signed birefringence characteristic value of the entire projection optical system, since the sizes of the effective sections are different among the optical members, the sizes of the effective sections of all the optical members are preliminarily normalized so that the maximum effective radius $r_n$ of each optical member becomes one as illustrated in FIG. 4A.

When a plurality of beams are radiated into the plane normal to the optical axis with the center at the intersection between the optical member and the optical axis, the sizes of the effective sections of all the optical members are preliminarily normalized so that the maximum effective radius $r_n$ of each optical member becomes one for each of the effective sections corresponding to the individual beams.

Further, in the cases wherein beams having the shape other than the circular cross section, for example, beams of the ring section or the elliptic section are radiated into the plane normal to the optical axis with the center at the intersection between the optical member and the optical axis, the sizes of the effective sections of all the optical members are also preliminarily normalized so that the maximum effective radius $r_n$ of each optical member becomes one for each of the effective sections corresponding to the individual beams.

For example, when the beams of the ring section are radiated, the sizes of the effective sections of all the optical members are preliminarily normalized so that the maximum outside radius of the ring becomes one, and the measurement of signed birefringence values can be performed in a manner similar to the measurement with the beams of the circular cross section described hereinafter. When the beams of the elliptic section are radiated, the sizes of the effective sections of all the optical members are preliminarily normalized so that the maximum outside length of the major axis of the ellipse becomes one, and the measurement of signed birefringence values can be carried out in a manner similar to the measurement with the beams of the circular section described below.

For measuring the signed birefringence characteristic value of the entire projection optical system, a first step is to establish a hypothetical model of concentric circles $C_{ij}$ with the center Oi and with their respective radii from the center on the effective section for one optical member Li, as illustrated in FIG. 4B. Then a birefringence value is measured at the kth measuring point $P_{ijk}$ on the jth concentric circle $C_{ij}$ with the radius of $r_j$ from the center $O_i$. Further, the sign is assigned to the measurement from the relation between the direction of the fast axis and the radial direction at the measuring point $P_{ijk}$ to obtain the signed birefringence value $A_{ijk}$ at the measuring point $P_{ijk}$.

Here the character "i" represents the numbers (i=1, 2, ..., m; 2≦m) of the optical members L forming the projection optical system. Further, the character "j" represents the numbers (j=1, 2, ..., n; 1≦n) of the concentric circles C with the center on the optical axis and with their respective radii from the optical axis different from each other, hypothetically given on the effective section normal to the optical axis in the optical member L. Further, the character "k" represents the numbers (k=1, 2, ..., h; 1≦h) of measuring points on the circumference of the concentric circles C. In this way the signed birefringence values $A_{ij1}$ to $A_{ijh}$ are measured at the predetermined measuring points $P_{ij1}$ to $P_{ijh}$ on each single concentric circle $c_{ij}$.

Then an average signed birefringence value $B_{ij}$, which is an arithmetic mean of the signed birefringence values at the measuring points on the circumference of the concentric circle $C_{ij}$ in the optical member Li, is calculated according to the equation below.

$$B_{ij} = \frac{\sum_{k=1}^{h} A_{ijk}}{h} \qquad (6)$$

Then $E_{ij}$, which indicates an average signed birefringence amount as the product of the average signed birefringence value $B_{ij}$ and the apparent thickness $T_i$, is calculated according to the equation below.

$$E_{ij} = B_{ij} \times T_i \qquad (5)$$

In this equation $T_i$ represents the apparent thickness of the optical member Li. This apparent thickness is either one properly selected from an average of thicknesses in the effective section of the optical member Li and an effective thickness based on matching with other members above and below the optical member Li when placed in the optical system.

Then an average change amount $G_j$ of signed birefringence values, which is a result of division of the summation of average signed birefringence amounts $E_{ij}$ in the entire projection optical system by the total path length D, is calculated according to the equation below.

$$G_j = \frac{\sum_{i=1}^{m} E_{ij}}{D} \qquad (3)$$

In this equation D represents an apparent total path length of the entire projection optical system indicated by the following equation.

$$D = \sum_{i=1}^{m} T_i \qquad (4)$$

Then the signed birefringence characteristic value H of the entire projection optical system, which is a result of division of the summation of average change amounts $G_j$ of the signed birefringence values in the entire projection optical system by the number n of concentric circles, is calculated according to the equation below.

$$H = \frac{\sum_{j=1}^{n} G_j}{n} \qquad (2)$$

When the signed birefringence characteristic value H of the entire projection optical system thus calculated satisfies the following equation, the entire projection optical system demonstrates excellent imaging performance and the projection exposure apparatus provided with such a projection optical system shows excellent resolution.

$$-0.5 \leq H \leq +0.5 \text{ nm/cm} \qquad (1)$$

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 7 is an explanatory diagram to illustrate a furnace for synthesis of a silica glass ingot used in the present invention.

FIG. 12A and FIG. 12B are explanatory diagrams to show an example of the structure of the illumination optical system in the projection exposure apparatus illustrated in FIG. 11.

FIGS. 15A to 15F are graphs to show distributions of average signed birefringence values in optical members used in Examples 1 to 3 and in Comparative Examples 1 to 3 of the projection optical system of the present invention.

DESCRIPTION OF THE PREFERRED EMBODIMENTS

Figure 5:
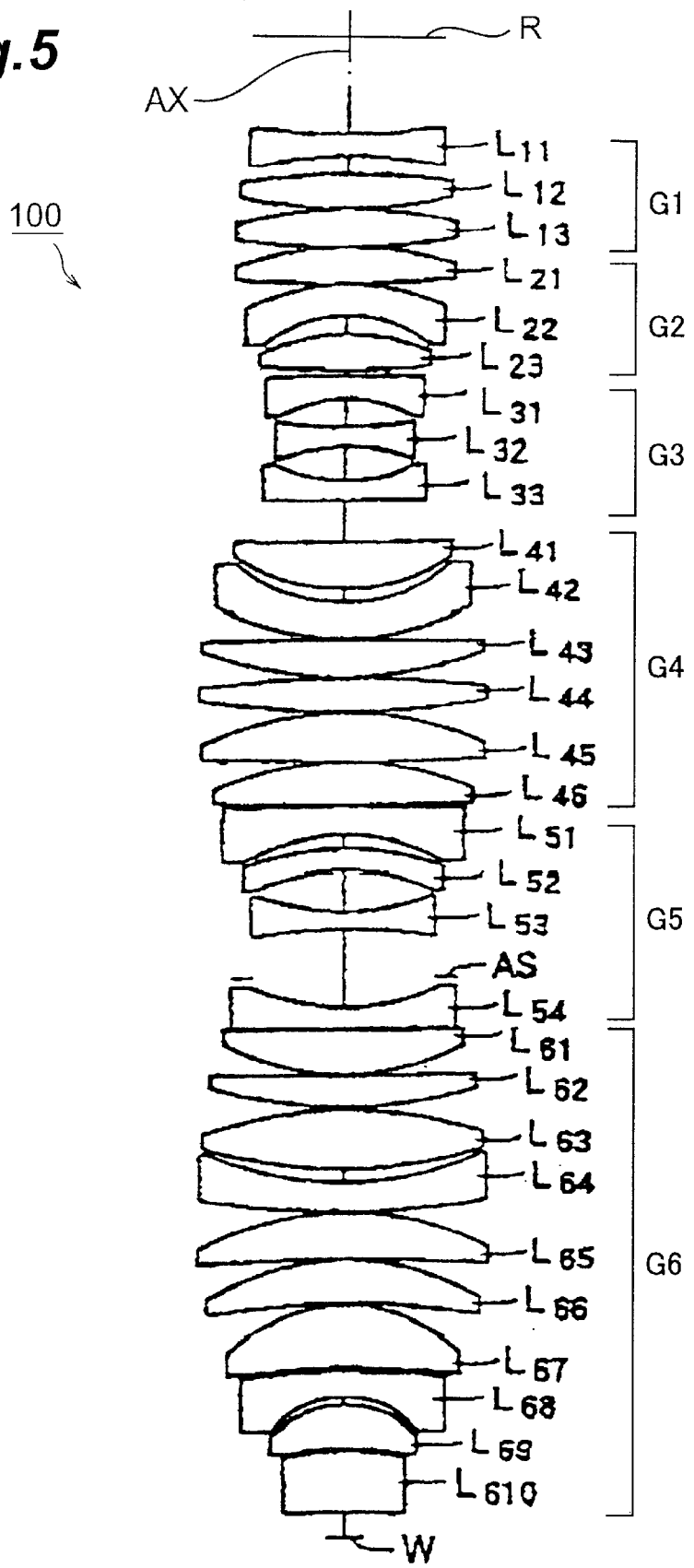
FIG. 5 is a schematic, structural diagram to show an example of the projection optical system of the present invention.

First, the projection optical system of the present invention will be described. FIG. 5 is a schematic, structural diagram to show an example of the projection optical system of the present invention.

The projection optical system 100 illustrated in FIG. 5 is composed of a first lens unit G1 of a positive power, a second lens unit G2 of a positive power, a third lens unit G3 of a negative power, a fourth lens unit G4 of a positive power, a fifth lens unit G5 of a negative power, and a sixth lens unit G6 of a positive power, which are arranged in the order named from the side of reticle R as a first object. The optical system is approximately telecentric on the object side (reticle R side) and on the image side (wafer W side) and has a reduction ratio. This projection optical system has N. A. of 0.6 and the projection magnification of ¼.

In this projection optical system, a single crystal of calcium fluoride is used at six positions of L45, L46, L63, L65, L66, and L67 for the purpose of correcting for chromatic aberration.

The above projection optical system of the present invention is designed in such a manner that the signed birefringence characteristic value of the entire projection optical system is calculated according to the aforementioned algorithms of Eqs. (1) to (6) from the distribution of signed birefringence values in the plane normal to the optical axis AX with the center at the intersection with the optical axis AX for each of the optical members L11 to L610 and that the optical members are combined with each other so as to satisfy the placement condition that this signed birefringence characteristic value of the entire projection optical system is between −0.5 and +0.5 nm/cm both inclusive.

When the optical members are combined so as to satisfy the aforementioned placement condition based on the signed birefringence values, the nonuniform distribution of birefringence values in each of the individual optical members can be quantitatively evaluated with attention on directions of the fast axis and the optical system can be assembled while quantitatively estimating the signed birefringence characteristic value of the entire optical system from the signed birefringence values of the respective members so as to cancel the distributions of birefringence values of the optical members with each other, whereby the projection optical system can be obtained with excellent imaging performance.

In the projection optical system of the present invention, it is preferable that the optical members be combined with each other so as to further satisfy such a placement condition that a Strehl value of signed birefringence values based on effective paths of the entire projection optical system is not less than 0.93.

The inventors discovered that use of Strehl intensities of signed birefringence values taking account of the effective paths in the center and surroundings thereof in the effective section of each optical member was effective to the evaluation of the birefringence distribution in the optical members. Since the Strehl value of birefringence first introduced by the inventors takes account of the effective paths of rays passing through the effective sections, it allows more precise evaluation of birefringence distribution in the optical members when combined with the evaluation with the signed birefringence characteristic value of the entire optical system.

This placement condition of each optical member based on the Strehl value of signed birefringence values is expressed based on the following equations.

$$0.93 \leq S \quad (7)$$

$$S = \prod_{i=1}^{m} S_i \quad (8)$$

$$S_i = 1 - \left(\frac{2\pi}{\lambda}\right)^2 \cdot \left(\frac{\sigma^2}{2} + \frac{|X|^2}{4}\right) \quad (9)$$

[In Eqs. (7) to (9), $\lambda$ indicates the wavelength of the light source. X represents an average of signed birefringence values determined from the distribution in an effective radial direction of signed birefringence values based on the effective optical paths obtained for the optical member Li by ray tracing of the entire projection optical system. $\sigma$ represents the standard deviation of signed birefringence values determined from the distribution in the effective radial direction of signed birefringence values based on the effective paths obtained for the optical member Li by ray tracing of the entire projection optical system. $S_i$ indicates the Strehl intensity of signed birefringence values based on the effective paths for each optical member Li. S represents the Strehl value of signed birefringence values based on the effective paths of the entire projection optical system in combination of all the optical members Li.]

In the projection optical system of the present invention, it is further preferable that the signed birefringence values around the center $O_i$ of the optical member Li be not more than 0.2 nm/cm. Since most of the light projected onto the optical members has the optical axis in the central part of the optical members, use of the optical members satisfying the above condition can greatly decrease the influence of birefringence as compared with cases of use of optical members having birefringence in the central area.

In the projection optical system of the present invention, it is also preferable that the distribution in the radial direction of average signed birefringence values $B_{ij}$ in the optical member Li have no extremum except at the center $O_i$. Further, where the distribution of signed birefringence values of the optical member has no extremum except at the center, it is easy to estimate the signed birefringence characteristic value of the entire optical system and desired optical performance can be achieved by effectively canceling the influence of birefringence of the individual members with each other.

In the projection optical system of the present invention, it is further preferable that a difference $\Delta B_i$ between a maximum and a minimum of the average signed birefringence values $B_{ij}$ in the optical member Li be not more than 2.0 nm/cm.

The inventors discovered that excellent imaging performance of the projection optical system was able to be attained by constructing the projection optical system of such optical members. It was further found that the projection exposure apparatus provided with the projection optical system was able to realize uniform resolution throughout the entire wafer surface. The larger the difference $\Delta B_i$ between maximum and minimum in the radial distribution of average signed birefringence values $B_{ij}$, the larger the dispersion in the average signed birefringence values $B_{ij}$ of the optical member, in turn, the dispersion in the signed birefringence values $A_{ijk}$. When light is projected onto an optical member in which the difference $\Delta B_i$ between maximum and minimum of average signed birefringence values $B_{ij}$ is larger than 2.0 nm/cm, the wavefront of the light is disturbed because of the large difference of signed birefringence values $A_{ijk}$ depending upon passing locations of light and it tends to extremely lower the imaging performance of the optical system.

In the projection optical system of the present invention, it is also preferable that a maximum $F_i$ of slope of a distribution curve in the radial direction of average signed birefringence values $B_{ij}$ in each optical member Li be not more than 0.2 nm/cm per 10 mm of radial width. Excellent imaging performance of the projection optical system can be attained by constructing the projection optical system of such optical members. Further, when the projection exposure apparatus is provided with such a projection optical system, the resolution becomes uniform throughout the entire wafer surface. Just as in the case of the large difference $\Delta B_i$ between maximum and minimum in the radial distribution of the average signed birefringence values $B_{ij}$ as described above, the larger the maximum $F_i$ of slope of the distribution curve in the radial direction of the average signed birefringence values $B_{ij}$, the larger the dispersion in the average signed birefringence values $B_{ij}$ of the optical member, in turn, the dispersion in the signed birefringence values $A_{ijk}$. When light is projected onto an optical member in which the maximum $F_i$ of slope of the distribution curve in the radial direction of the average signed birefringence values $B_{ij}$ is greater than 0.2 nm/cm per 10 mm of radial width, the wavefront of light is disturbed because of the large difference of signed birefringence values $A_{ijk}$ depending upon passing locations of light and it tends to greatly lower the imaging performance of the optical system.

Although the conventional "magnitude of birefringence (birefringence value)" and the "difference between maximum and minimum of signed birefringence values" in the present invention both are expressed in units of nm/cm, the former is a value indicated by the maximum |max| of birefringence values without consideration to the directions of the fast axis, whereas the latter is indicated by the difference between a maximum value in a portion where the direction of the fast axis is parallel to the radial direction of the optical member (the maximum of plus-signed birefringence values) and a maximum value in a portion where the direction of the fast axis is perpendicular to the radial direction of the optical member (the maximum of minus-signed birefringence values): $(+A_{max})-(-A_{max})$; or $(+B_{max})-(-B_{max})$ in the case of the average signed birefringence values $B_{ij}$.

Next, the production method of the projection optical system according to the present invention will be described below.

Figure 6:
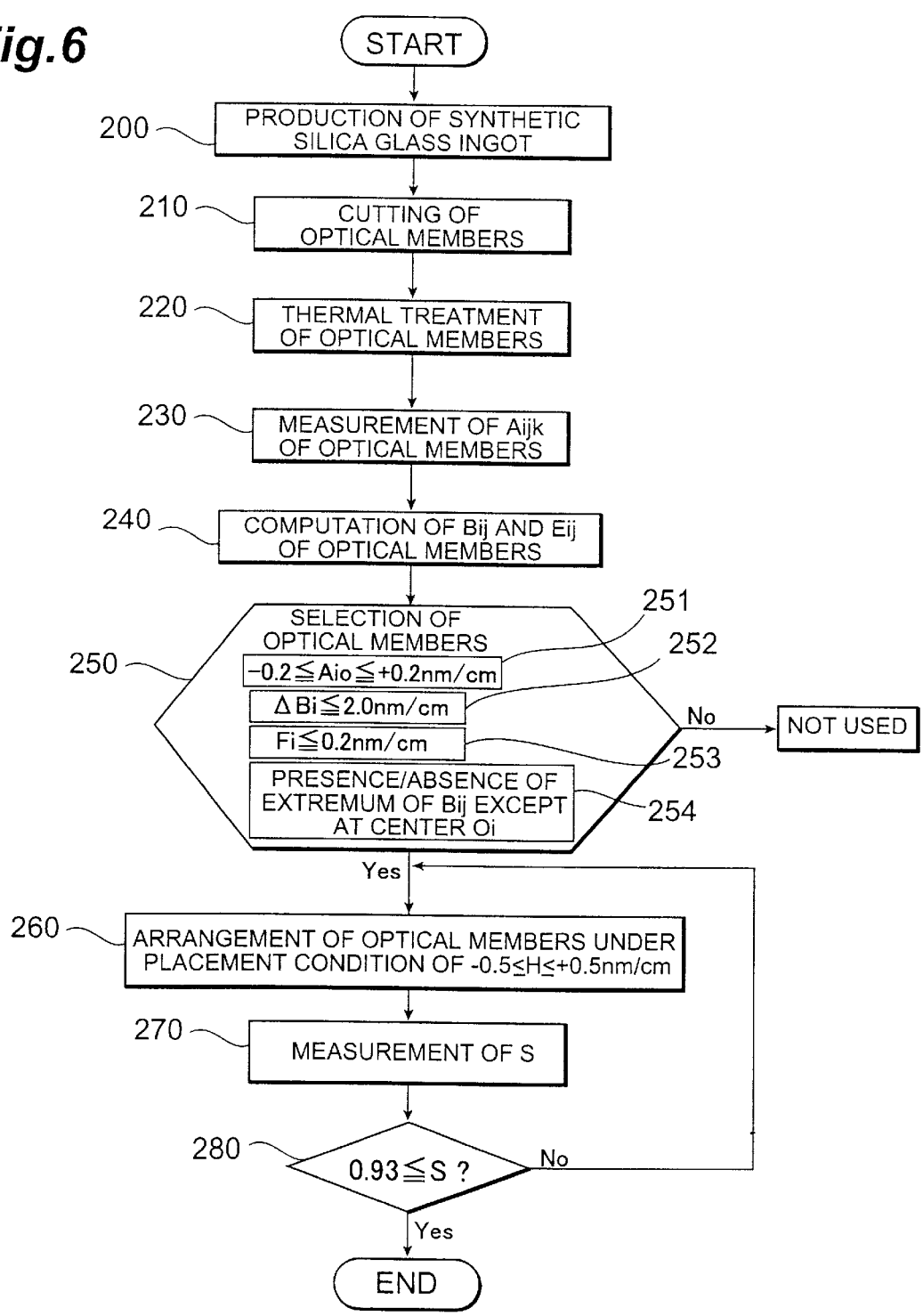
FIG. 6 is a flowchart to show an example of the production method of the projection optical system according to the present invention.

FIG. 6 is a flowchart to show an example of the production method of the projection optical system of the present invention.

As illustrated, the production method of the projection optical system of the present invention is mainly comprised of step 200 of producing a synthetic silica glass ingot or ingots, step 210 of cutting optical members from the synthetic silica glass ingot(s) obtained, step 220 of carrying out a thermal treatment of the optical members thus cut, step 230 of measuring the signed birefringence values $A_{ijk}$ in the optical members after the thermal treatment, step 240 of calculating the average signed birefringence values $B_{ijk}$ and the average signed birefringence values $E_{ij}$ from the signed birefringence values $A_{ijk}$ obtained, step 250 of selecting optical members to be used, from the distribution data of signed birefringence values in the optical members obtained in step 240, step 260 of arranging a plurality of optical members selected in step 250, under the placement condition based on the signed birefringence characteristic value of the entire projection optical system, step 270 of measuring the Strehl value of signed birefringence values based on the effective paths for the projection optical system thus assembled in step 260, and step 280 of rearranging the optical members under the placement condition based on the Strehl value obtained in step 270.

The production method of the projection optical system of the present invention will be detailed below according to the flowchart of FIG. 6.

First described is the production of the synthetic silica glass in step 200.

The silica glass members used in the projection optical system of the present invention are made by either of methods, for example, including a) a method in which a silicon compound is subjected to hydrolysis in oxyhydrogen flame to obtain glass particles (so called soot) and in which the glass particles are deposited to form porous glass (so called a soot body). The porous glass is treated at temperatures over near the softening point (preferably, the melting point) thereof to become transparent, thereby obtaining transparent silica glass; b) a method in which a silicon compound is subjected to hydrolysis in oxyhydrogen flame to effect deposition of resultant glass particles on a target and vitrification thereof simultaneously, thus obtaining the transparent silica glass. The method of a is called a soot method and the method of b a direct method.

In the soot method, there are no specific restrictions on how to form the porous glass, and it is made by one selected from a VAD method, an OVD method, a sol-gel method, and so on.

The following describes a method of producing the silica glass member by the direct method (which is also called a flame hydrolysis process).

FIG. 7 shows a synthesis furnace 400 for synthesis of the silica glass ingot 470 used in the present invention.

A burner 410 is made of silica glass and in multiple tube structure and is installed with its tip portion directed from the top of the furnace toward the target 420. The furnace wall is composed of furnace frame 440 and refractory 430 and is equipped with an observation window (not illustrated), a window 450 for monitoring with an IR camera, and an exhaust system 460. The target 420 for formation of ingot 470 is located in the lower part of the furnace and the target 420 is coupled through a support shaft 480 to an XY stage (not illustrated) located outside the furnace. The support shaft 480 can be rotated by a motor and the XY stage can be moved two-dimensionally in the X-direction and in the Y-direction by an X-axis servo motor and by a Y-axis servo motor.

An oxygen-containing gas and a hydrogen-containing gas are ejected from the burner 410 to be mixed to create the flame. The feed of the silicon compound diluted with a carrier gas is ejected from the central part of the burner into this flame whereupon the feed is decomposed by hydrolysis to form silica glass particles (soot). This soot is deposited onto the rotating and swinging target and, at the same time as it, it is fused and vitrified to obtain the ingot of transparent silica glass. At this time, the target is pulled down in the Z-direction so that the upper part of the ingot is covered by the flame and so that the position of the synthetic surface in the upper part of the ingot is always kept at an equal distance from the burner.

The feed ejected from the central part of the burner 410 can be one selected from silicon chlorides such as $SiCl_4$, $SiHCl_3$, and so on; silicon fluorides such as $SiF_4$, $Si_2F_6$, and so on; organic silicon compounds including siloxanes such as hexamethyldisiloxane, octamethylcyclotetrasiloxane, tetramethylcyclotetrasiloxane, and so on, silanes such as methyltrimethoxysilane, tetraethoxysilane, tetramethoxysilane, and so on; $SiH_4$, $Si_2H_6$, and so on.

The simplest method of obtaining a silica glass member in which the signed birefringence values around the center of the effective section of the silica glass member are between −0.2 and +0.2 nm/cm both inclusive, is a method of producing a large-diameter ingot by the above-stated production method of the synthetic silica glass and cutting the optical member of a desired diameter from the ingot. In this case, it is necessary to match the geometric center of the optical member with that of the ingot. Since the large-diameter ingot tends to have a flat distribution of singed birefringence values as compared with a small-diameter ingot, a distribution of distortion also becomes flat in the optical member cut out of the ingot. This is possibly because the temperature gradient in the central part of the synthetic surface of the ingot is smaller than the temperature gradient in the peripheral part of the synthetic surface close to the side surface of the ingot.

For obtaining a silica glass member with no extremum in the distribution of signed birefringence values except around the center of the effective section, the large-diameter ingot is also produced first, the distribution of signed birefringence values thereof is checked, and the optical member is cut out of the ingot so as not to have no extremum except in the central part. In another method, the optical member is kept at high temperatures enough to relax birefringence and thereafter is subjected to an annealing operation to gradually cool the optical member, whereby the silica glass member is obtained with the distribution of signed birefringence values in-which birefringence in the central part is not more than 0.2 nm/cm and in which there is no extremum except in the central part.

The cutting method from the large-diameter ingot and the annealing operation to relax birefringence are also effective in obtaining the optical members with little dispersion in the distribution of signed birefringence values inside the members wherein the difference between maximum and minimum of signed birefringence values is not more than 2.0 nm/cm or wherein the maximum of slope of the distribution of signed birefringence values in the radial direction of signed birefringence values is not more than 0.2 nm/cm per 10 mm of width. It is also possible to decrease the dispersion in the signed birefringence values to some extent, by controlling synthesis conditions, for example, by optimizing the temperature distribution in the upper part (synthesis surface) of the ingot during the synthesis.

The optical members are then cut in step 210 from the ingot(s) thus produced. In step 220, further, the optical members thus cut are subjected to the thermal treatment of quick heating→short-time retention→quick cooling, thereby restraining the dispersion in the signed birefringence values in the optical members as described previously. Produced in this way are candidates for optical members having various shapes to construct the projection optical system illustrated in FIG. 5. Specifically, for producing the projection optical system illustrated in FIG. 5, a plurality of silica glass lenses are fabricated in the same shape and in the same size for the silica glass lens L11 illustrated in FIG. 5.

Then the signed birefringence values are measured for each of the optical members in step 230. Namely, the signed birefringence values $A_{ijk}$ are measured at a plurality of measuring points $P_{ijk}$ on a plurality of concentric circles postulated in the effective section perpendicular to the optical axis of the optical members.

Measuring methods of birefringence applicable in the present invention will be described below. A phase modulation method will be described first. An optical system is composed of a light source, a polarizer, a phase modulation element, a sample, and an analyzer. The light source is an He-Ne laser or a laser diode, and the phase modulation element is a photoelastic converter. Light from the light source is converted into linearly polarized light by the polarizer and the linearly polarized light is incident to the phase modulation element. The light from the phase modulation element to be projected onto the sample is modulated light with states of polarization continuously varying as linearly polarized light→circularly polarized light→linearly polarized light by the element. During the measurement the sample is rotated about the beam incident to a measuring point on the sample to find a peak of output of a detector and the amplitude at that peak is measured to determine the direction of the fast axis (or the slow axis) and the magnitude of birefringent phase difference. The measurement can also be performed without rotation of the sample by use of a Zeeman laser as the light source. It is also possible to employ the phase shift method and the optical heterodyne interferometry in the present invention.

In addition, the measurement can also be conducted by the following methods though they are a little inferior in measurement accuracy.

A rotary analyzer method employs a device configuration in which the sample between the light source and the photodetector is interposed between the polarizer and the rotary analyzer. Signals from the detector are measured while rotating the analyzer placed after the sample to be measured, and a phase difference is calculated between a maximum and a minimum of the signals from the detector.

In a phase compensation method there are a light source, a polarizer, a sample, a phase compensator, an analyzer, and a photodetector placed. When the axes of the polarizer and analyzer are positioned in mutually orthogonal states, linearly polarized light incident to the sample to be measured is converted into elliptically polarized light because of the birefringence of the sample. Then the phase compensator is adjusted so as to return the light to linearly polarized light. With adjustment of the compensator, the signal becomes almost null at the detector. A phase compensation value at the highest extinction rate is an amount of birefringence.

The measurement can also be performed by a simple method of placing a standard sample in a crossed Nicols optical system and comparing the sample with the standard sample if the thickness of the measured sample is large enough.

Each measurement of birefringence is given the sign of + when the direction of the fast axis is parallel to the diameter of the member, but the sign of − when perpendicular, as described previously. A small measurement of birefringence can have an inclination while the fast axis is not always perfectly parallel or normal to the diameter. In this case the sign of + is assigned if the inclination is closer to parallel than the angle of 45° relative to the diameter, whereas the sign of − if the inclination is closer to normal.

In step 240 the average signed birefringence values $B_{ijk}$ are then calculated from the signed birefringence values $A_{ijk}$ for each of the optical members Li, obtained in step 230. Here each average signed birefringence value $B_{ijk}$ is an arithmetic mean of a plurality of signed birefringence values at a plurality of measuring points on a concentric circle $C_{ij}$ at an equal distance $r_j$ from the center $O_i$ of the effective section.

How to calculate the average signed birefringence values $B_{ijk}$ from the signed birefringence values $A_{ijk}$ will be described below referring to FIG. 8A, FIG. 8B, FIG. 9A, FIG. 9B, FIG. 10A, and FIG. 10B.

Figure 8A:
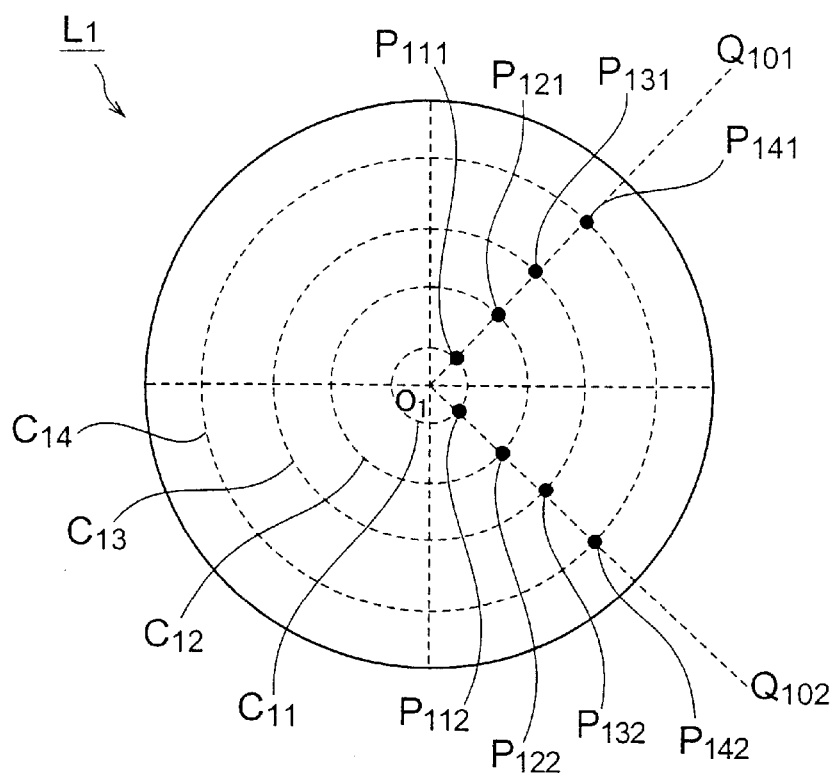
FIG. 8A is a cross-sectional view of an optical member to show measuring points of signed birefringence values in the optical member forming the projection optical system of the present invention and FIG. 8B is a graph to show a distribution of average signed birefringence values in the optical member illustrated in FIG. 8A.
Figure 8B:
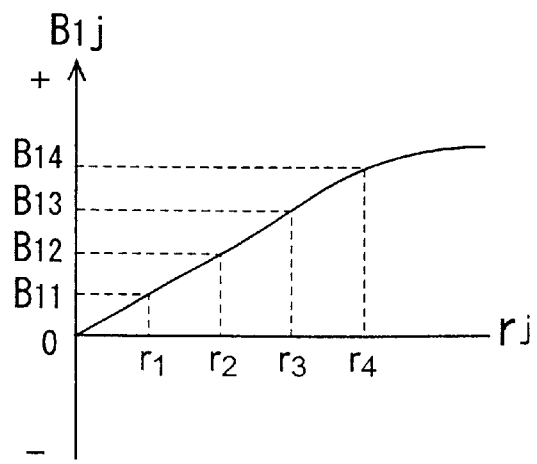

FIG. 8A is a schematic diagram where the measuring points are intersections $P_{111}$, $P_{121}$, $P_{131}$, $P_{141}$, $P_{112}$, $P_{122}$, $P_{132}$, and $P_{142}$ between concentric circles $C_{11}$, $C_{12}$, $C_{13}$, and $C_{14}$ having their respective radii $r_1$, $r_2$, $r_3$, and $r_4$ from the center $O_1$ on the effective section of the optical member L1 and two straight lines Q101 and Q102 extending in a radial direction from the center $O_1$, In this case, an average signed birefringence value on each concentric circle of the optical member L1 is an arithmetic mean of signed birefringence values obtained from two measuring points on the circumference of a single concentric circle. More specifically, in the case of the concentric circle $C_{11}$, the arithmetic mean of signed birefringence values $A_{111}$ and $A_{112}$ obtained at the measuring point $P_{111}$ and at the measuring point $P_{112}$ on the circumference of the concentric circle $C_{11}$ is the average signed birefringence value $B_{11}$, represents the signed birefringence values of the point group on the circumference of the concentric circle $C_{11}$. In similar fashion, thereafter, the average signed birefringence values $B_{12}$ to $B_{14}$ are calculated for the concentric circles $C_{12}$ to $C_{14}$. Then the average signed birefringence values $B_{11}$ to $B_{14}$ are illustrated as a function of distance from the center $O_1$, whereby the distribution of average signed birefringence values in the radial direction of the optical member L1 can be quantitatively understood. For example, where the average signed birefringence values $B_{11}$ to $B_{14}$ all are positive values monotonically increasing in the radial direction, the profile as illustrated in FIG. 8B can be obtained as the distribution of average signed birefringence values in the radial direction of the optical member L1.

Figure 9A:
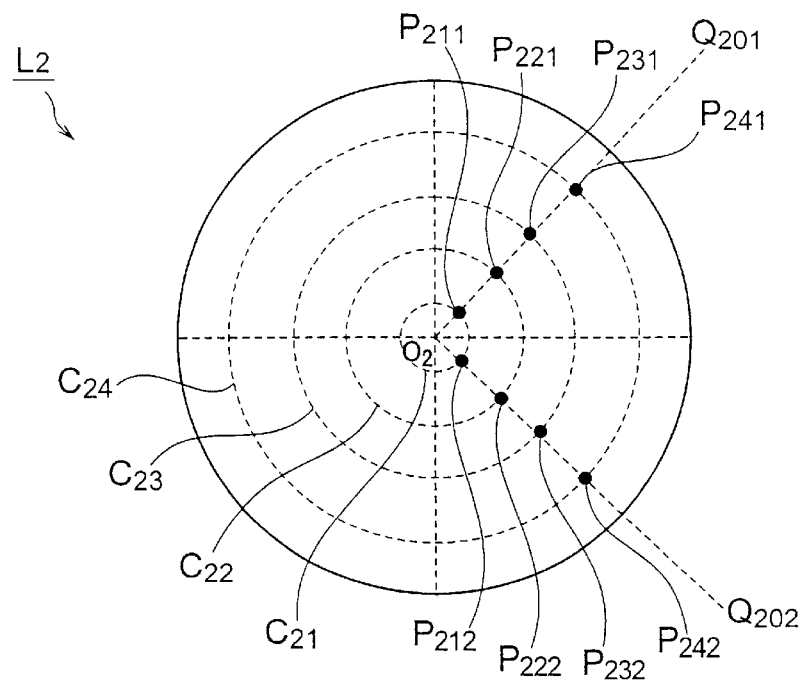
FIG. 9A is a cross-sectional view of another optical member to show measuring points of signed birefringen values in the optical member forming the projection optical system of the present invention and FIG. 9B is a graph to show a distribution of average signed birefringence values in the optical member illustrated in FIG. 9A.
Figure 9B:
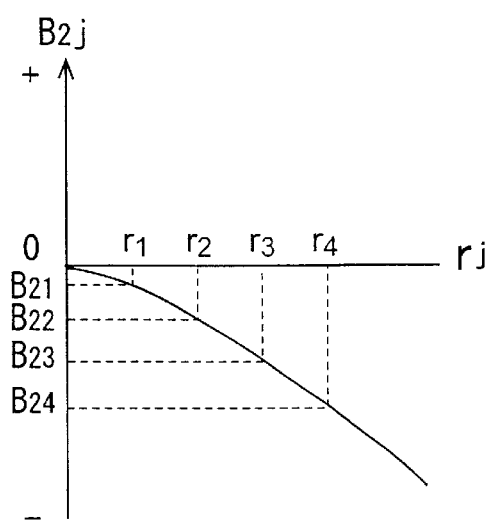

FIG. 9A is a schematic diagram where the measuring points are intersections $P_{211}$, $P_{221}$, $P_{231}$, $P_{241}$, $P_{212}$, $P_{222}$, $P_{232}$, and $P_{242}$ between concentric circles $C_{21}$, $C_{22}$, $C_{23}$, and $C_{24}$ having their respective radii $r_1$, $r_2$, $r_3$, and $r_4$ from the center $O_2$ on the effective section of the optical member L2 and two straight lines $Q_{201}$ and $Q_{202}$ extending in a radial direction from the center $O_2$. In this case, the average signed birefringence values $B_{21}$ to $B_{24}$ are also obtained for the concentric circles $C_{21}$ to $C_{24}$, as described in the FIG. 8A. When the average signed birefringence values $B_{21}$ to $B_{24}$ are illustrated as a function of distance from the center $O_2$, the distribution of average signed birefringence values in the radial direction of the optical member L2 can be quantitatively understood. For example, where the average signed birefringence values $B_{21}$ to $B_{24}$ all are negative values monotonically decreasing in the radial direction, the profile as illustrated in FIG. 9B is obtained as the distribution of average signed birefringence values in the radial direction of the optical member L2.

Figure 10A:
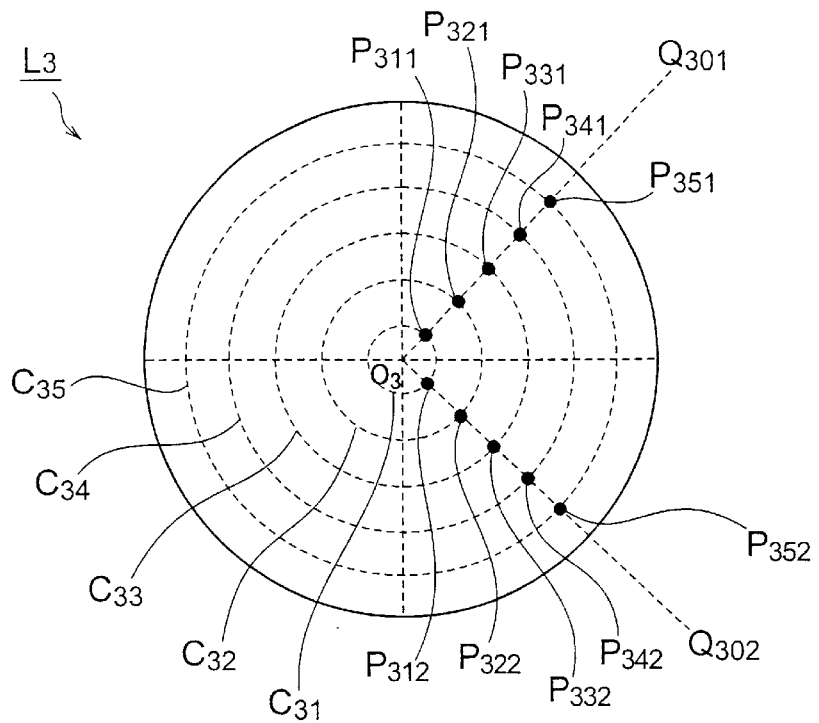
FIG. 10A is a cross-sectional view of another optical member to show measuring points of signed birefringence values in the optical member forming the projection optical system of the present invention and FIG. 10B is a graph to show a distribution of average signed birefringence values in the optical member illustrated in FIG. 10A.
Figure 10B:
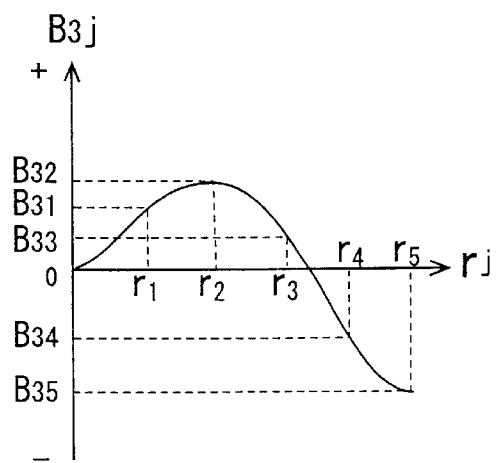

FIG. 10A is a schematic diagram where the measuring points are intersections $P_{311}$, $P_{321}$, $P_{331}$, $P_{341}$, $P_{351}$, $P_{312}$, $P_{322}$, $P_{332}$, $P_{342}$, and $P_{352}$ between concentric circles $C_{31}$, $C_{32}$, $C_{33}$, $C_{34}$, and $C_{35}$ having their respective radii $r_1$, $r_2$, $r_3$, $r_4$, and $r_5$ from the center $O_3$ on the effective section of the optical member L3 and two straight lines $Q_{301}$ and $Q_{302}$ extending in the radial direction from the center $O_3$. In this case, the average signed birefringence values $B_{21}$ to $B_{25}$ are also obtained for the concentric circles $C_{31}$ to $C_{35}$, as described in the FIG. 8A. When the average signed birefringence values $B_{31}$ to $B_{35}$ are illustrated as a function of distance from the center $O_3$, the distribution of average signed birefringence values in the radial direction of the optical member L3 can be quantitatively understood. For example, supposing that the average signed birefringence values $B_{31}$ to $B_{35}$ are positive values, that $B_{34}$ and $B_{35}$ are negative values, and that these average signed birefringence values $B_{31}$ to $B_{33}$ take a maximum value near $r_2$ and monotonically decrease in the radial direction from $r_2$ to $r_5$, the profile as illustrated in FIG. 10B can be obtained as the distribution of average signed birefringence values in the radial direction of the optical member L3.

Further, in step 240, the average singed birefringence amounts $E_{ijk}$ for each of the optical members are calculated according to Eq. (5) from the average signed birefringence values $B_{ijk}$ for each optical member, obtained as described above, and the apparent thickness $T_i$ of each optical member.

Figure 1A:
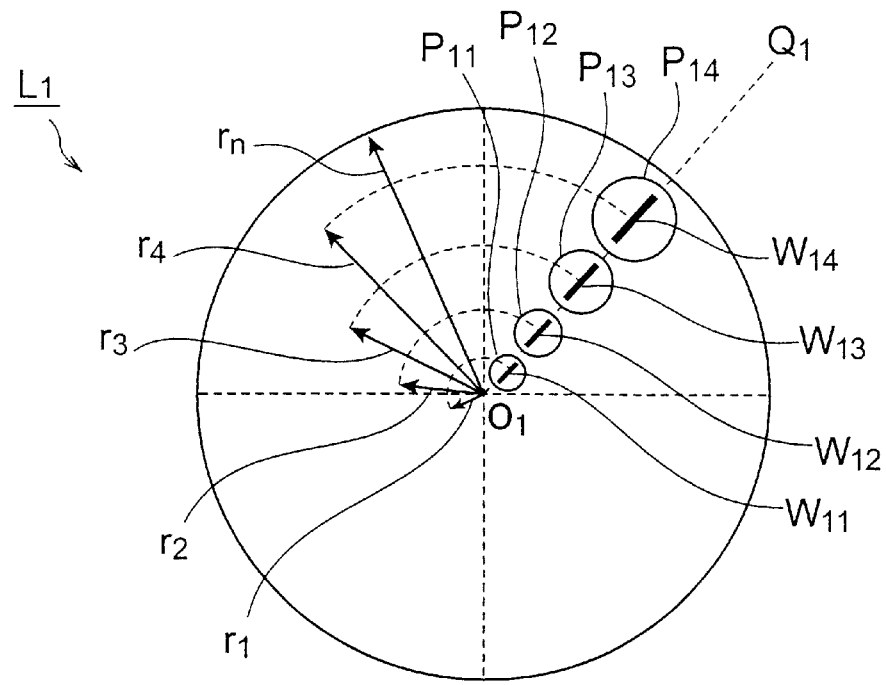
FIG. 1A is an explanatory diagram to show the concept of signed birefringence values and FIG. 1B is a graph to show the distribution of singed birefringence values in the optical member illustrated in FIG. 1A.
Figure 1B:
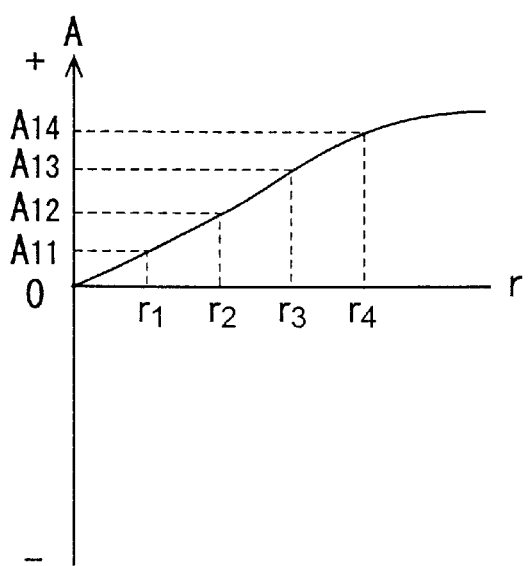
Figure 2A:
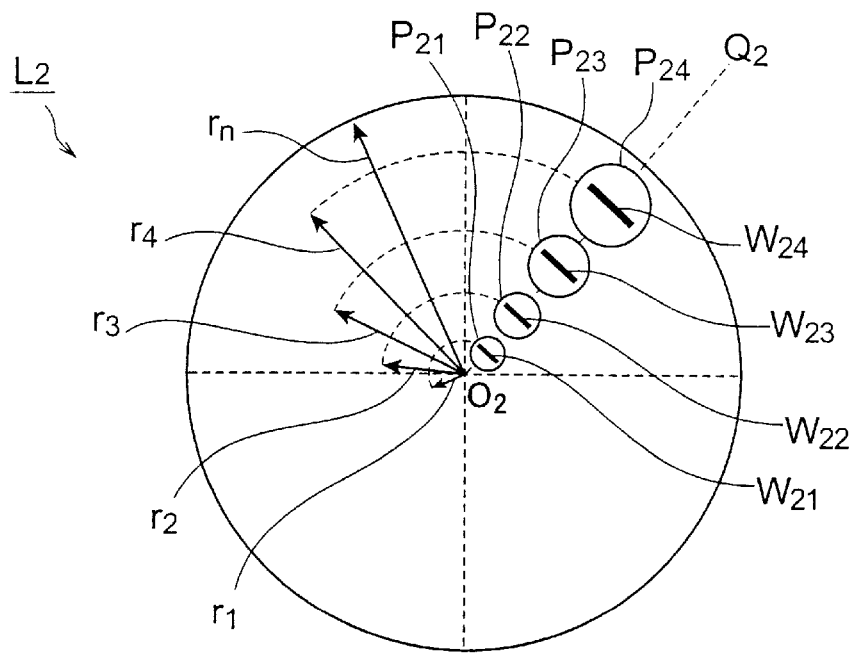
FIG. 2A is another explanatory diagram to show the concept of signed birefringence values and FIG. 2B is a graph to show the distribution of singed birefringence values in the optical member illustrated in FIG. 2A.
Figure 2B:
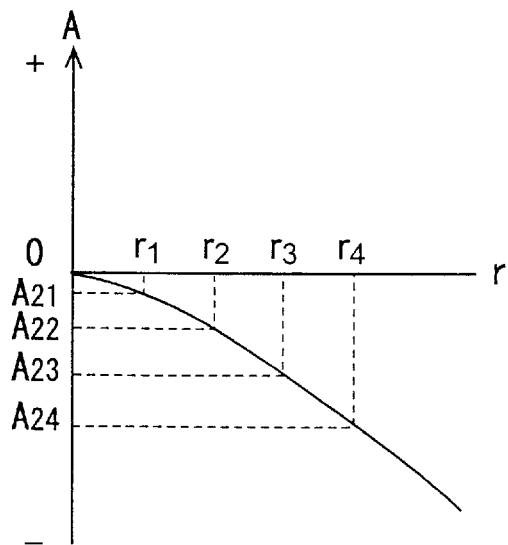
Figure 3A:
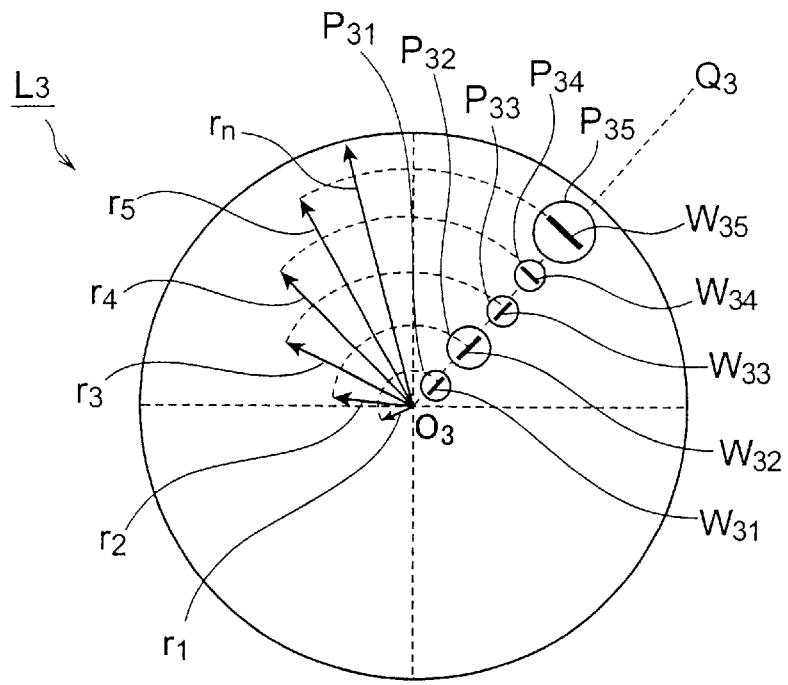
FIG. 3A is another explanatory diagram to show the concept of signed birefringence values and FIG. 3B is a graph to show the distribution of singed birefringence values in the optical member illustrated in FIG. 3A.
Figure 3B:
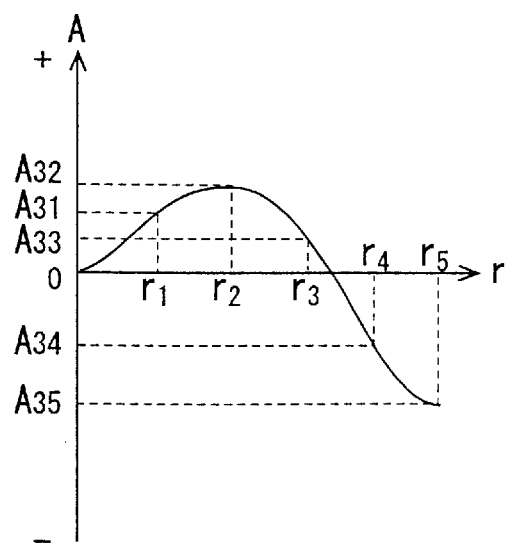
Figure 4A:
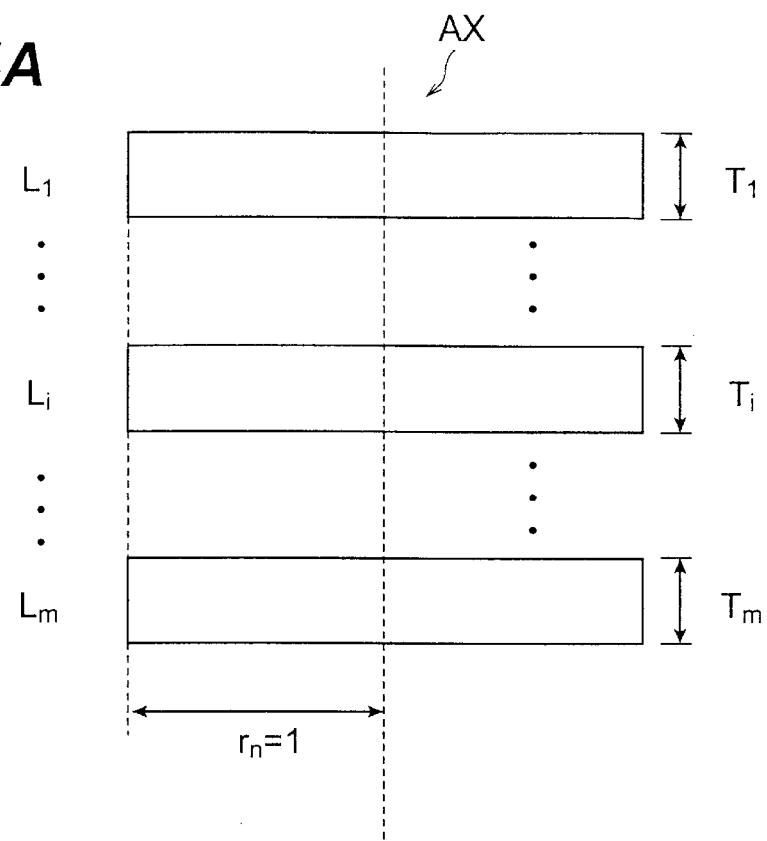
FIG. 4A is a side view to show a plurality of optical members constituting a projection optical system and FIG. 4B is a cross-sectional view of the optical member forming the projection optical system of FIG. 4A.
Figure 4B:
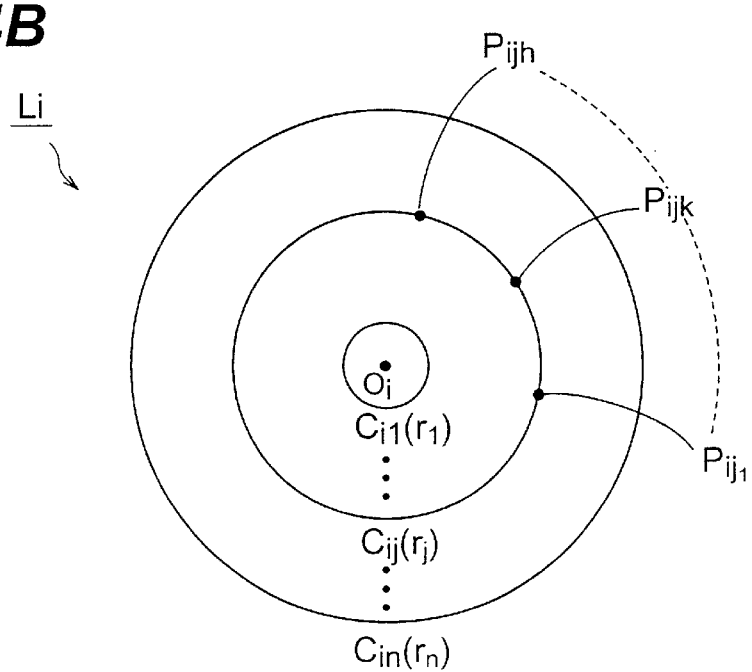

Next, optical members used are selected in step 250. On this occasion, since the optical members have their respective effective sections different from each other, depending upon their roles in the projection optical system, as illustrated in the projection optical system in FIG. 5, the effective sections are normalized so that the maximum effective radius is one, for all the optical members, as illustrated in FIG. 4A. Based on the common effective radius after the normalization, the following selection of optical members is carried out with reference to the radial distributions of average signed birefringence values $B_{ijk}$ of all the optical members, thereby narrowing down the candidates for the optical members used at their respective positions in the projection optical system.

The selection conditions of optical members in this step 250 are as follows: selection condition 251; the signed birefringence values around the center $O_i$ of the optical member Li are not more than 0.2 nm/cm, selection condition 252; the difference $\Delta B_i$ between maximum and minimum of the average signed birefringence values $B_{ij}$ in the optical member Li is not more than 2.0 nm/cm, selection condition 253; the maximum $F_i$ of slope of the distribution curve in the radial direction of the average signed birefringence values $B_{ij}$ in each optical member Li is not more than 0.2 nm/cm per 10 mm of radial width, and selection condition 254; the radial distribution of the average signed birefringence values $B_{ij}$ in the optical member Li has no extremum except at the center $O_i$.

By using optical members to meet all or at least one of the above selection conditions 251 to 254, the projection optical system with high imaging performance can be constructed more efficiently.

In step 260 the optical members are then arranged so that the signed birefringence characteristic value H of the entire projection optical system, described previously by Eq. (1), becomes between −0.5 and +0.5 nm/cm both inclusive. At this time, the signed birefringence characteristic value H of the entire projection optical system is calculated according to Eqs. (2) to (4) described previously. The projection optical system arranged in this way demonstrates excellent imaging performance.

In step 270, 280 the optical members are then combined with each other so as to further satisfy the placement condition that the Strehl value of the signed birefringence values based on the effective paths of the entire projection optical system is not less than 0.93. Since the Strehl value of birefringence takes account of the effective paths of rays passing the effective sections, more precise evaluation of birefringence distributions in the optical members can be made when combined with the evaluation with the signed birefringence characteristic value of the entire optical system. The Strehl value S of birefringence is calculated based on Eq. (8) and Eq. (9), using the data of radial distributions of signed birefringence values obtained by ray tracing.

For example, in the case of the projection optical system 100 illustrated in FIG. 5, the measurement results of radial distributions of the signed birefringence values for the silica glass lenses L11 to L610 except for the lenses L45, L46, L63, L65, L66, and L67 made of the single crystal of calcium fluoride, are entered into a computer for calculation of the Strehl value. Then ray-passing points on each lens are determined on the optical axis, in the paraxial area, off the axis, and so on by a technique according to ray tracing used in calculation of aberration of optical systems or the like, and the Strehl value is calculated by substituting the signed birefringence values corresponding to the passing points into Eq. (9). Namely, a plurality of Strehl values are calculated corresponding to a plurality of rays incident at a variety of incident angles into the projection optical system 100 and a minimum among them is determined as a Strehl value of the combination of the samples.

As for the distributions of signed birefringence values of the six lenses made of the single crystal of calcium fluoride, a theoretical value can be put into the computer, or an actually measured value of a material having a standard distribution of birefringence values can be entered. As another method, it is also possible to prepare the material for these six lenses at one time and evaluate them together with the silica glass lenses.

The above production method of the projection optical system was described as an example provided with step 250 of selecting the optical members, step 270 of measuring the Strehl value, and step 280 of arranging the optical members, based on the Strehl value, but the production method of the projection optical system of the present invention is not limited to the above example form; the above three steps all are omissible steps in the production method of the projection optical system of the present invention.

In the above description, a value calculated by the following method can also be used as a guide of reference for evaluating the influence of birefringence of the entire projection optical system instead of the above signed birefringence characteristic value of the entire projection optical system in the cases wherein the radial distribution of average signed birefringence values $B_{ijk}$ is a slightly monotonically increasing or slightly monotonically decreasing distribution while the birefringence values are almost zero around the center for all the optical members, in the measurement of the radial distribution of the average signed birefringence values $B_{ijk}$ for each of the optical members. Namely, it is a value calculated in such a way that an arithmetic mean is calculated from values in the radial direction of the average signed birefringence values $B_{ijk}$ in each optical member to be defined as a signed birefringence value representing the member and that the signed birefringence values of all the optical members are added up. The members are combined so as to make this addition result zero in the entire optical system, which allows simple selection of members taking the influence of birefringence into consideration.

Figure 11:
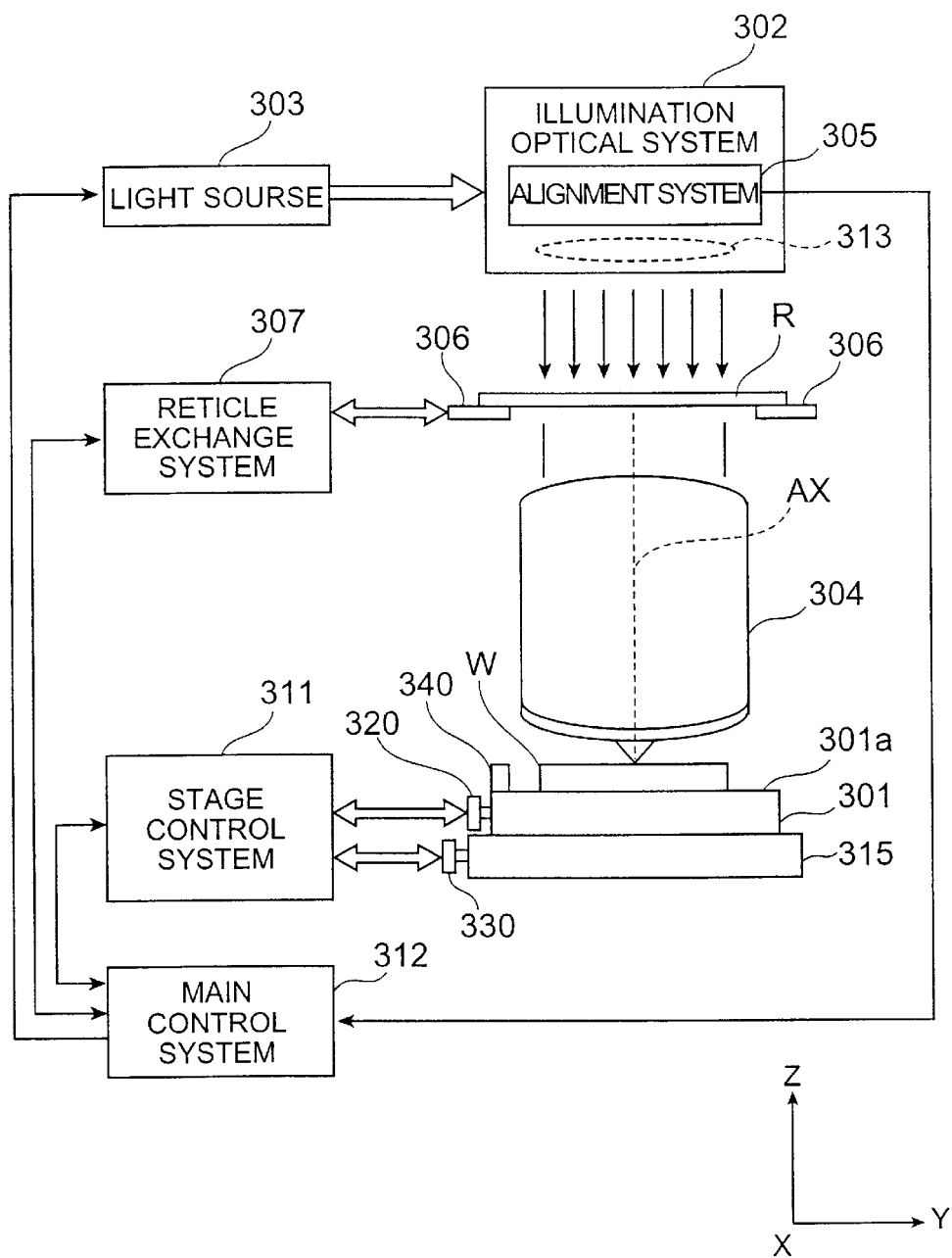
FIG. 11 is a schematic, structural diagram to show an example of the projection exposure apparatus of the present invention.

FIG. 11 is a schematic, structural diagram of an example of the projection exposure apparatus provided with the projection optical system of the present invention. In FIG. 11, the Z-direction is taken along a direction parallel to the optical axis of the projection optical system 304, the Y-direction along a direction normal to the Z-direction within the plane of the drawing, and the X-direction along a direction normal to the plane of the drawing and to the Z-direction.

The projection exposure apparatus illustrated in FIG. 11 is mainly composed of an exposure light source 303, a reticle R in which a pattern original image is formed, an illumination optical system 302 for illuminating the reticle R with light emitted from the exposure light source 303, a projection optical system 304 for projecting the pattern image outputted from the reticle R onto the wafer (photosensitive substrate) W, and an alignment system 305 for achieving alignment between the reticle R and the wafer W.

The wafer W is mounted on a leveling stage (not illustrated) and this leveling stage is placed on a Z-stage 301, which can be finely moved in the direction of the optical axis of the projection optical system (i.e., in the Z-direction) by a driving motor 320. The Z-stage 301 is mounted on an XY stage 315, which can be moved in the two-dimensional (XY) directions in the step-and-repeat method by a driving motor 330. The reticle R is mounted on a reticle stage 306, which can be moved two-dimensionally in the horizontal plane. The exposure light from the exposure light source 303 uniformly illuminates the pattern formed in the reticle R through the illumination optical system 302 whereupon the pattern image of the reticle R is transferred into a shot area of the wafer W by the projection optical system 304. This exposure light can be one having the wavelength selected from 248 nm (KrF excimer laser), 193 nm (ArF excimer laser), 157 nm ($F_2$ laser), and so on.

After completion of projection of the pattern of the reticle R into one shot area on the wafer W, the XY stage 315 undergoes such stepping movement that a next shot area of the wafer W is aligned with the exposure area of the projection optical system 304. The two-dimensional position of the leveling stage with the wafer W mounted thereon is always monitored, for example, in the resolution of about 0.01 μm by measuring the distance to a moving mirror 340 fixed to the leveling stage, with a laser interferometer (not illustrated), and output of the laser interferometer is supplied to a stage control system 311.

The reticle R is positioned on the reticle stage 306 so that the center of the transferred pattern on the reticle R is aligned with the optical axis AX of the projection optical system 304. The positioning of the reticle R is carried out using a plurality of reticle alignment marks (reticle marks) provided near the periphery of the reticle R. The reticle marks include two types of reticle marks, i.e., reticle marks for positioning in the X-direction and reticle marks for positioning in the Y-direction. The alignment system 305 uses the exposure light, which is extracted by splitting part of the exposure light from the exposure light source 303, as illumination light (alignment light). The alignment system 305 includes alignment units located one at the position of each reticle alignment mark.

The illumination light having passed through the illumination optical system 302 is then incident to the reticle marks provided outside the pattern area of the reticle R. The reticle marks are, for example, rectangular transparent windows formed in an opaque region around the pattern. The alignment light reflected from the reticle mark portions is incident again into the alignment system 305. On the other hand, the alignment light having passed through the reticle marks travels through the projection optical system 304 to be incident onto substrate alignment marks (wafer marks) provided in the periphery of each shot area on the wafer W. The wafer marks do not always have to be provided in the peripheral area of each shot area, but may also be provided at predetermined positions of the wafer, for example, only in the peripheral region of the wafer. The wafer marks also include two types of wafer marks, i.e., wafer marks for positioning in the X-direction and wafer marks for positioning in the Y-direction corresponding to the reticle marks. Reflected light from the wafer marks travels in paths opposite to those of the incident light and through the projection optical system 304 and through the reticle mark portions, to be incident again into the alignment system 305.

Receiving the reflections of the alignment light from the reticle R and from the wafer W in this way, the alignment system 305 detects the relative positions of the reticle R and the wafer W. Output of the alignment system 305 is supplied to a main control system 312. Output of the main control system 312 is supplied to a reticle exchange system 307 and to the stage control system 311 to adjust the spatial positions of the reticle R and the wafer W. As a result, registration can be maintained at high accuracy between the pattern formed in each shot area on the wafer W and the pattern image of the reticle R to be projected thereto.

FIG. 12A and FIG. 12B are schematic, structural diagrams to show the detailed structure of the illumination optical system 302 in the projection exposure apparatus illustrated in FIG. 11.

FIG. 12A is a front view of the illumination optical system 302 when observed from the Y-direction of FIG. 11 and FIG. 12B is a front view of the illumination optical system 302 when observed from the X-direction of FIG. 11. The both figures are illustrated with omitting the alignment system 305 which uses the split part of the exposure light incident to the illumination optical system 302.

The exposure light source 303 (not illustrated) emits an almost parallel beam having the wavelength of 248 nm (KrF excimer laser), 193 nm (ArF excimer laser), 157 nm ($F_2$ laser), or the like and the cross-sectional shape of the parallel beam at this point is rectangular. This parallel beam from the exposure light source 303 is incident to a beam shaping optical system 20 as a beam shaping section for shaping the beam into a predetermined cross-sectional shape. This beam shaping optical system 20 is composed of two cylindrical lenses (20A, 20B) having refractive power in the Y-direction; the cylindrical lens 20A on the light source side has negative refractive power to diverge the beam in the X-direction, while the cylindrical lens 20B on the illuminated surface side has positive refractive power to condense the diverging beam from the light-source-side cylindrical lens 20A into a parallel beam. Therefore, the parallel beam from the exposure light source 303, having passed through the beam shaping optical system 20, is one shaped in the rectangular shape of the beam section having a predetermined size with the beam width expanded in the Y-direction. The beam shaping optical system 20 can also be constructed of a combination of cylindrical lenses having positive refractive power, an anamorphic prism, or the like.

The shaped beam from the beam shaping optical system 20 is incident to a first relay optical system 21. Here the first relay optical system 21 has a front unit (21A, 21B) of positive refractive power consisting of two positive lenses, and a rear unit (21C, 21D) of positive refractive power consisting of two positive lenses, and they are arranged so that the front unit (21A, 21B) of the first relay optical system 21 forms a converging point (light source image) I at the focal point of this front unit on the reticle R side (rear side) and so that the rear unit (21C, 21D) of the first relay optical system 21 has the focal point on the light source side (front side), matched with the focal point of the front unit (21A, 21B). Then this first relay optical system 21 has the function of keeping the exit plane of the exposure light source 303 in conjugate with the entrance plane of an optical integrator 30 as first multiple light source image forming means, described hereinafter. This function of the first relay optical system 21 serves to correct deviation of the light illuminating the optical integrator 30 due to angular deviation of the light from the exposure light source 303 and increase tolerance to the angular deviation of the light from the exposure light source 303. A guide optical system for guiding the light from the exposure light source 303 to the first multiple light source image forming means is comprised of the beam shaping optical system 20 and the first relay optical system 21.

The beam having passed through the first relay optical system 21 is then incident to the optical integrator 30 as the first multiple light source image forming means for forming a plurality of light source images arranged linearly in three rows. This optical integrator 30 is composed of a plurality of lens elements of the double-convex shape having an almost square lens section, and the whole of the optical integrator 30 has a rectangular cross section. Each lens element of the double-convex shape has equal curvature (refractive power) in the Y-direction and in the X-direction.

For this reason, each of parallel beams passing through the individual lens elements forming the optical integrator 30 is condensed to form a light source image on the exit side of each lens element. Therefore, a plurality of light source images are formed in the number equal to the number of lens elements and at the exit position A1 of the optical integrator 30, substantially creating secondary light sources there.

Beams from the plurality of secondary light sources created by the optical integrator 30 are condensed by a second relay optical system 40 to be further incident to an optical integrator 50 as second multiple light source image forming means for forming a plurality of light source images.

This optical integrator 50 is composed of a plurality of lens elements of the double-convex shape having a rectangular lens section and the cross-sectional shape of this lens element is similar to that of the optical integrator 30. The whole of the optical integrator 50 has a square cross section. Each of the lens elements has equal curvature (refractive power) in the direction on the plane of FIG. 12a and in the direction on the plane of FIG. 12b.

For this reason, each of beams from the optical integrator 30 traveling through the individual lens elements forming the optical integrator 50 is condensed to form a light source image on the exit side of each lens element. Therefore, a plurality of light source images arranged in the square shape are formed at the exit position A2 of the optical integrator 50, substantially creating tertiary light sources there.

The second relay optical system 40 keeps the entrance position B1 of the optical integrator 30 in conjugate with the entrance position B2 of the optical integrator 50 and also keeps the exit position A1 of the optical integrator 30 in conjugate with the exit position A2 of the optical integrator 50. Further, the optical integrator 30 and the optical integrator 50 were described in the shape of the fly's eye lenses in the above description, but there are no specific restrictions on the shape of the optical integrators used in the illumination system of the projection exposure apparatus of the present invention; for example, they can be selected from micro-fly's eyes consisting of a plurality of extremely small lens elements, rodlike internal reflection type optical elements (kaleidoscope rods), diffracting optical elements (DOE), and so on.

An aperture stop AS having an aperture of a predetermined shape is located at the position A2 where the tertiary light sources are formed, or at a position near it, and beams from the tertiary light sources, formed in a circular shape by this aperture stop AS, are condensed by a condenser optical system 60 as a condensing optical system to uniformly illuminate the reticle R as an object to be illuminated, in a slit shape.

The projection optical system 304 illustrated in FIG. 11 is one in which the optical members are combined with each other so as to satisfy the placement condition that the signed birefringence characteristic value of the entire projection optical system is between −0.5 and +0.5 nm/cm both inclusive. The optical members are also combined with each other so as to further satisfy the placement condition that the Strehl value of the signed birefringence values based on the effective paths of the entire projection optical system is not less than 0.93. Further, the optical members used are those satisfying the condition that the signed birefringence values around the center of the effective section are between −0.2 and +0.2 nm/cm both inclusive, the condition that the radial distribution of average signed birefringence values has no extremum except at the center, the condition that the difference $\Delta B_i$ between maximum and minimum of average signed birefringence values is not more than 2.0 nm/cm, and the condition that the maximum $F_i$ of slope of the distribution curve in the radial direction of the average signed birefringence values $B_{ij}$ is not more than 0.2 nm/cm per 10 mm of radial width.

Since the influence of birefringence in the optical members can be controlled in the minimum level by the provision of the projection optical system of the present invention, the projection exposure apparatus can be constructed with high resolution.

The projection optical system of the present invention, the production method thereof, and the projection exposure apparatus using it will be described below in detail with examples.

<Production of synthetic silica glass>

First described is a method for producing the silica glass members used in Example 1 to Example 3 and in Comparative Example 1 to Comparative Example 3 which will be described below.

Figure 13:
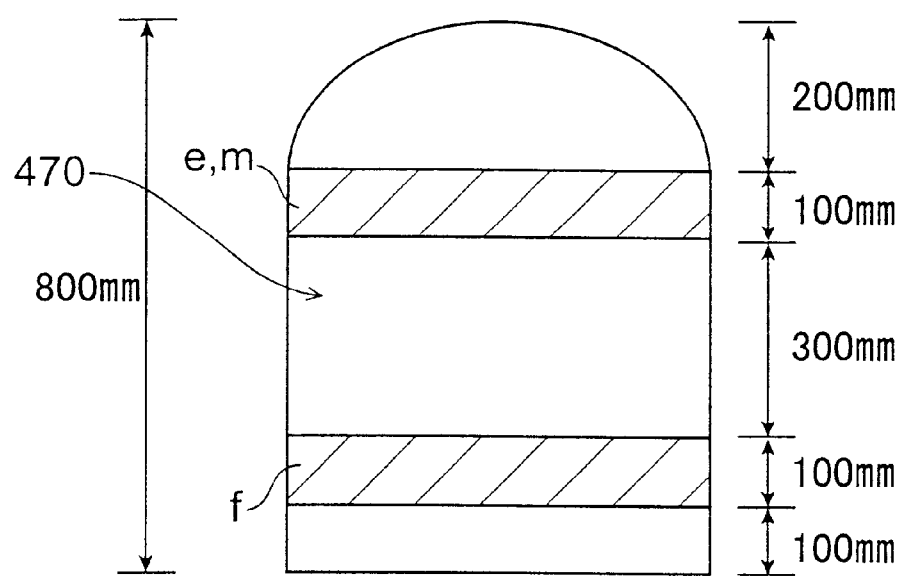
FIG. 13 is a schematic diagram to show a silica glass ingot produced as a primary material for optical members forming the examples and comparative examples of the projection optical system of the present invention.

Using the synthesis furnace illustrated in FIG. 7, the synthetic silica glass was prepared by the direct method (flame hydrolysis method). First, silicon tetrachloride was ejected from the central part of the multi-tube burner to be subjected to hydrolysis in the oxyhydrogen flame, thereby obtaining the glass particles. The particles were vitrified while being deposited onto the rotating and swinging target, to obtain the silica glass ingot 470 of φ400 mm×t800 mm illustrated in FIG. 13. The swinging width (stroke) in the X-axis direction at this time was set to 100 mm in the first synthesis and to 150 mm in the second synthesis.

In each of the syntheses, the ingot 470 was made to cool in this shape and thereafter test pieces e, m, and f were cut out in the cylindrical shape of φ400 mm×t100 mm from the ingot. Specifically, the test piece e was cut from the portion at the heights of 500 to 600 mm from the bottom surface of the ingot 470 obtained in the first synthesis, and the test piece m was from the portion at the heights of 500 to 600 mm from the bottom surface of the ingot 472 obtained in the second synthesis. The test piece f was cut from the portion at the heights of 100 to 200 mm from the bottom surface of the ingot 470 obtained in the first synthesis or the ingot 472 obtained in the second synthesis. These test pieces e, m, f were heated up to the temperature of 1000° C., kept thereat for ten hours, and thereafter cooled at the rate of 10° C./hour down to 500° C. After that, they were again made to cool, thereby yielding the thermally treated test pieces e, m, f.

On the other hand, silica glass ingots of φ120 mm to φ300 mm were prepared by the production method of the synthetic silica glass similar to the above method except that the swinging width (stroke) in the X-axis direction was set to 50 mm. Test pieces were cut in appropriate size from these ingots and the thermal treatment was conducted under conditions similar to those above. Then test pieces g of φ100 mm to φ280 mm, necessary for the optical system of FIG. 5, were cut out.

<Evaluation of synthetic silica glass>

The radial distribution of signed birefringence values was measured for each of the disk-shaped test pieces e, m, f, and g of the synthetic silica glass. The measurement of birefringence was carried out by the phase modulation method. The measuring points were intersections between a plurality of concentric circles postulated on the effective section of each of the test pieces e, m, f, g and two straight lines extending in the radial direction from the center of the effective section, as illustrated in FIG. 10A.

First, values of the signed birefringence values after cut in desired diameters were estimated from the data of the radial distributions of signed birefringence values for the test pieces e, m, f, g and the selection of usable test pieces was conducted so as to minimize the signed birefringence values of the entire optical system by combining members having the plus-signed birefringence values with members having the minus-signed birefringence values.

The sizes of the members necessary for assembly of the projection optical system 100 illustrated in FIG. 5 are φ100 to φ280. It was found that in this range the test pieces e, m, f except for the test pieces g had the signed birefringence values which monotonically increased or decreased in the radial direction and the absolute values of which were relatively small, 2 nm/cm.

Then an average was calculated of the radial distribution of signed birefringence values for each of the test pieces e, m, f to obtain a tentative typical value of the signed birefringence values for each of the test pieces. Then the optical system was assembled by selecting and combining the test pieces e, m, f, typical values thereof were added up in the entire optical system, and it was confirmed that the addition result of the entire optical system was ±0. In this way the selection of members was first conducted in the simple manner with consideration to the influence of birefringence and then the test pieces e, m, f with good characteristics were cut more accurately out of the glass ingots. The method of evaluating the birefringent characteristics in the members by use of the tentative typical values of the signed birefringence values as described above is just a guide and the aforementioned signed birefringent characteristic value of the entire projection optical system will be calculated again on the occasion of actual assembly of the projection optical system.

Figure 14B:
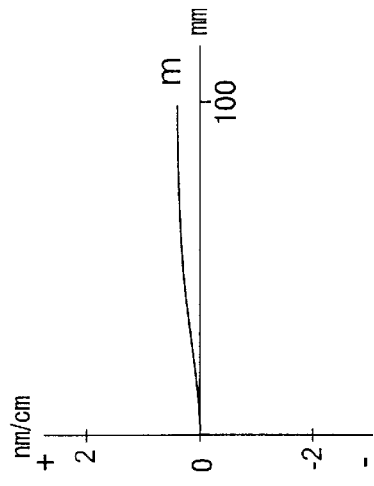
FIGS. 14A to 14D are graphs to show distributions of average signed birefringence values in optical members forming the examples and comparative examples of the projection optical system of the present invention.

Based on the above selection, the test pieces e, m, f of silica glass were again cut out of the ingots so that the center position of each test piece was aligned with a rotationally symmetric center position of each ingot determined from the ingot outside diameter. In practice, the members of the desired sizes were cut so that the center position of each test piece was matched with the center of the thermal treatment of each thermally treated or annealed test piece. FIGS. 14A to 14C present radial distribution curves of average signed birefringence values $B_{ijk}$ in test pieces of φ200 mm among the test pieces e, m, f of the cylindrical shape thus cut. Each of these synthetic silica glasses has a monotonically increasing or monotonically decreasing pattern of average signed birefringence values $B_{ijk}$. The signed birefringence values $A_{io}$ around the center of each test piece e, m, f are all between −0.2 and +0.2 nm/cm both inclusive. It was also verified that each of the test pieces e, m, f had no extremum of average signed birefringence values $B_{ijk}$ except at the center. Further, it was verified that the maximum $F_i$ of slope of the radial distribution curve of average signed birefringence values $B_{ijk}$ was not more than 0.2 nm/cm per 10 mm and that the difference $\Delta B_i$ between maximum and minimum in the radial distribution of average signed birefringence values $B_{ijk}$ was not more than 2.0 nm/cm.

Figure 14D:
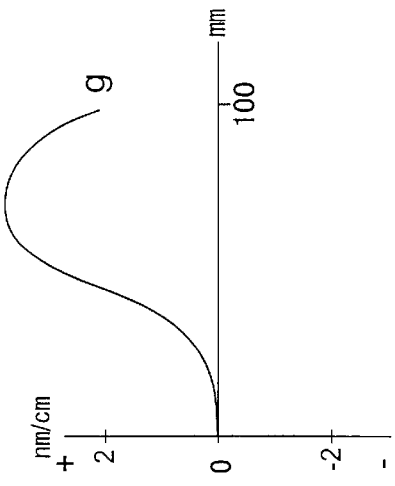
Figure 14A:
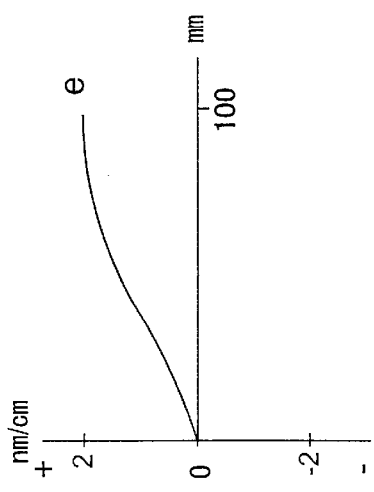
Figure 14C:
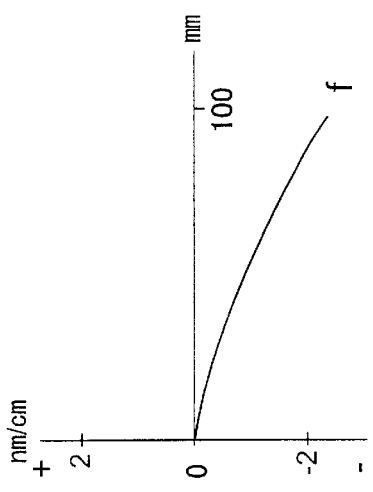
Figure 16A:
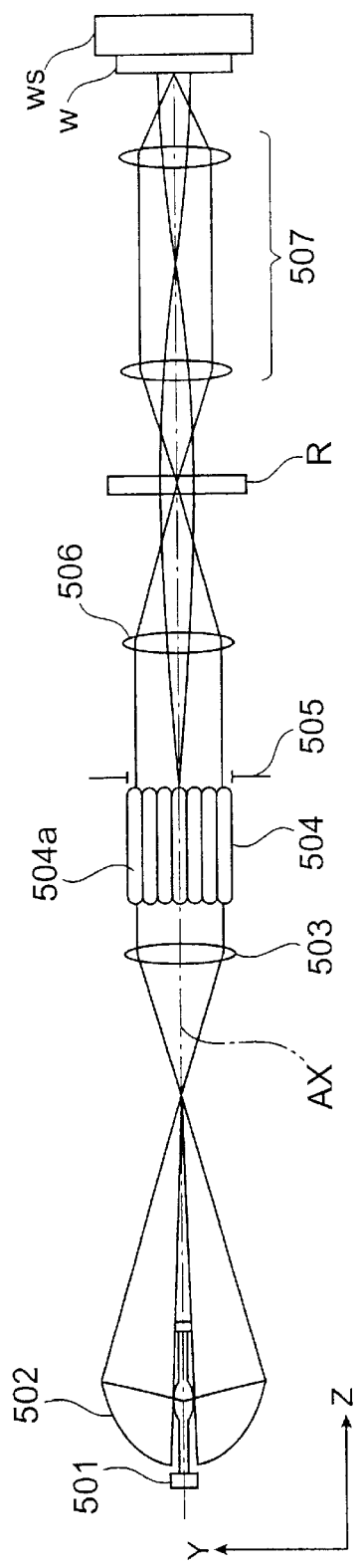
FIG. 16A is a schematic, structural diagram to show an example of the conventional projection exposure apparatus
Figure 16B:
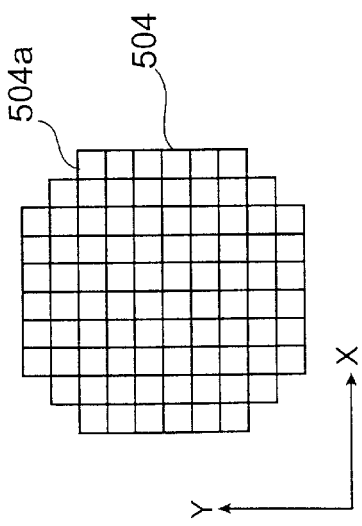
FIG. 16B is a cross-sectional view of the fly's eye lens used in the projection exposure apparatus of FIG. 16A.

On the other hand, FIG. 14D presents a radial distribution curve of average signed birefringence values $B_{ij}$ in a test piece of φ200 mm among the test pieces g of the cylindrical shape cut out. It was found that the test piece g had a positive maximum at the position between 70% and 80% in the radius except around the center in the radial distribution of average signed birefringence values $B_{ij}$.

A plurality of pieces were produced for each of the above test pieces e, m, f, g in order to actually assemble the projection optical system using them. Specifically, a plurality of silica glass ingots were first prepared under the same conditions as in the synthesis method described previously and a plurality of pieces were produced for each of the above test pieces e, m, f, g so that their radial distribution characteristics of the average signed birefringence values $B_{ij}$ of the test pieces cut out of the plurality of silica glass ingots thus formed were matched with those of the above test pieces e, m, f, g.

EXAMPLE 1

The above test pieces e, m, f were processed into the respective lens shapes and the projection optical system 100 illustrated in FIG. 5 was assembled. More specifically, the twenty three lenses except for the lenses L45, L46, L63, L65, L66, and L67 made of the calcium fluoride crystal out of the optical members constituting the projection optical system 100 were made of the test pieces e, m, and f. Then the signed birefringence characteristic value H of the entire projection optical system and the Strehl value S of signed birefringence values were calculated for the complete projection optical system, and the system in placement demonstrating the best values was defined as Example 1. Further, the resolution was measured where Example 1 was used as the projection optical system of the projection exposure apparatus illustrated in FIG. 11. FIG. 15A shows the radial distributions of average signed birefringence values $B_{ij}$ in a combination of one each of the test pieces e, m, f.

EXAMPLE 2

The projection optical system was assembled in the same manner as in Example 1 except that the test pieces e, f were used. Further, the resolution was measured where Example 2 was applied to the projection optical system of the projection exposure apparatus illustrated in FIG. 11. FIG. 15B shows the radial distributions of average signed birefringence values $B_{ij}$ in a combination of one each of the test pieces e, f.

EXAMPLE 3

The projection optical system was assembled in the same manner as in Example 1 except that the test pieces m, f, and g were used. Further, the resolution was measured where Example 3 was applied to the projection optical system of the projection exposure apparatus illustrated in FIG. 11. FIG. 15C shows the radial distributions of average signed birefringence values $B_{ij}$ in a combination of one each of the test pieces m, f, g.

COMPARATIVE EXAMPLE 1

The projection optical system was assembled in the same manner as in Example 1 except that the test piece g was used. Further, the resolution was measured where Comparative Example 1 was applied to the projection optical system of the projection exposure apparatus illustrated in FIG. 11. FIG. 15D shows the radial distribution of average signed birefringence values $B_{ij}$ of the test piece g.

COMPARATIVE EXAMPLE 2

The projection optical system was assembled in the same manner as in Example 1 except that the test pieces f, g were used. Further, the resolution was measured where Comparative Example 2 was applied to the projection optical system of the projection exposure apparatus illustrated in FIG. 11. FIG. 15E shows the radial distributions of average signed birefringence values $B_{ij}$ in a combination of one each of the test pieces f, g.

COMPARATIVE EXAMPLE 3

The projection optical system was assembled in the same manner as in Example 1 except that the test piece f was used. Further, the resolution was measured where Comparative Example 3 was applied to the projection optical system of the projection exposure apparatus illustrated in FIG. 11. FIG. 15F shows the radial distribution of average signed birefringence values $B_{ij}$ of the test piece g.

Table 1 presents the optical characteristics based on the signed birefringence of the projection optical systems in Examples 1 to 3 and in Comparative Examples 1 to 3 described above and the measured values of resolution of the projection exposure apparatus using them.

|  | SILICA GLASS USED | Aio nm/cm | EXTREMUM OF Bij EXCEPT AT CENTER Oi | Δ Bi nm/cm | Fi nm/cm | H nm/cm | S | RESOLUTION |
|---|---|---|---|---|---|---|---|---|
| Ex. 1 | e, m, f | e: ≈0<br>m: ≈0<br>f: ≈0 | e: NO<br>m: NO<br>f: NO | e: 1.6<br>m: 1.6<br>f: 0.5 | e: ≦0.2<br>m: ≦0.2<br>f: ≦0.1 | 0.12 | 0.99 | 0.15 |
| Ex. 2 | e, f | e: ≈0<br>f: ≈0 | e: NO<br>f: NO | e: 1.6<br>f: 1.6 | e: ≦0.2<br>f: ≦0.1 | 0.17 | 0.97 | 0.18 |
| Ex. 3 | m, f, g | m: ≈0<br>f: ≈0<br>g: ≈0 | m: NO<br>f: NO<br>g: PRESENT | m: 1.6<br>f: 1.6<br>g: 3.5 | m: ≦0.2<br>f: ≦0.1<br>g: ≦0.4 | 0.38 | 0.94 | 0.18 |
| Cmpr. 1 | g | g: ≈0 | g: PRESENT | g: 3.5 | g: ≦0.4 | 1.9 | 0.85 | UNMEASURABLE |
| Cmpr. 2 | f, g | f: ≈0<br>g: ≈0 | f: NO<br>g: PRESENT | f: 1.6<br>g: 3.5 | f: ≦0.1<br>g: ≦0.4 | 0.6 | 0.92 | 0.20 |
| Cmpr. 3 | f | f: ≈0 | f: NO | f: 1.6 | f: ≦0.1 | 0.93 | 0.90 | 0.22 |

The results of the optical characteristics of Examples 1 to 3 in Table 1 verified that the excellent imaging performance was demonstrated by the projection optical systems of the present invention satisfying the placement condition based on the signed birefringence values, i.e., the condition that the signed birefringence characteristic value of the entire projection optical system was between −0.5 and +0.5 nm/cm both inclusive. It was also verified that the very high resolution was achieved where the projection optical systems of the present invention were used as the projection optical system of the projection exposure apparatus. Particularly, the projection exposure apparatus employing Example 1 attained the high resolution of 0.15.

The excellent imaging performance was also achieved in Example 3 partly using the test piece g with great dispersion in the radial distribution of average signed birefringence values $B_{ij}$ and the projection exposure apparatus using it demonstrated the good value of resolution, which verified the validity of the production method of the projection optical system of the present invention in which the optical members were arranged so as to keep the signed birefringence characteristic value between −0.5 and +0.5 nm/cm both inclusive with paying attention to the distributions of signed birefringence values in the optical members.

On the other hand, the projection optical systems in Comparative Example 1 to Comparative Example 3 had the signed birefringence characteristic values of not less than +0.5 nm/cm and failed to demonstrate the good imaging performance and the projection exposure apparatus using them failed to yield as good values of resolution as in Examples 1 to 3. Particularly, in Comparative Example 1 the wavefront aberration of the entire projection optical system was far over the measurable range and it was thus impossible to measure the resolution.

As described above, the present invention allows us to quantitatively evaluate the nonuniform distributions of birefringence values in the optical members with attention on directions of the fast axis and further allows us to assemble the optical systems while quantitatively estimating the signed birefringence characteristic value of the entire optical system from the signed birefringence values of the respective optical members so as to cancel out the distributions of birefringence in the optical members. Therefore, the invention permits minimization of the influence from the nonuniform distributions of birefringence values in the optical members on the imaging performance of the projection optical system or on the resolution of the projection exposure apparatus and thus provides the projection optical system with high imaging performance, the production method thereof, and the projection exposure apparatus capable of achieving the high resolution.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system comprising at least two silica glass optical members, wherein said optical members are combined with each other so as to satisfy such a placement condition that a signed birefringence characteristic value of the entire projection optical system is between −0.5 and +0.5 nm/cm both inclusive, said signed birefringence characteristic value of the entire projection optical system being calculated in such a way that a birefringence value is measured at each of points in a plane normal to the optical axis with a center at an intersection of each optical member with the optical axis, a distribution of signed birefringence values in each optical member is obtained based on the birefringence values and directions of the fast axis thereof, and the signed birefringence characteristic value is calculated based on the distributions of signed birefringence values.

2. The projection optical system according to claim 1 wherein said optical members are combined with each other so as to further satisfy such a placement condition that a Strehl value of said signed birefringence values based on effective paths of the entire projection optical system is not less than 0.93.

3. The projection optical system according to claim 1 wherein said signed birefringence values around said center in the plane normal to the optical axis of each said optical member is between −0.2 and +0.2 nm/cm both inclusive.

4. The projection optical system according to claim 1 wherein said distribution of signed birefringence values in the plane normal to the optical axis of each said optical member has no extremum except around said center.

5. The projection optical system according to claim 1 wherein a difference between a maximum and a minimum of said signed birefringence values in the plane normal to the optical axis of each said optical member is not more than 2.0 nm/cm.

6. The projection optical system according to claim 1 wherein a maximum of slope of said distribution of signed birefringence values in a radial direction in the plane normal to the optical axis of each said optical member is not more than 0.2 nm/cm per 10 mm of radial width.

7. The projection optical system according to claim 1 wherein said placement condition of the optical members based on the signed birefringence characteristic value of the entire projection optical system is expressed based on the following equations:

$$-0.5 \leq H \leq +0.5 \text{ nm/cm} \tag{1}$$

$$H = \frac{\sum_{j=1}^{n} G_j}{n} \tag{2}$$

$$G_j = \frac{\sum_{i=1}^{m} E_{ij}}{D} \tag{3}$$

$$D = \sum_{i=1}^{m} T_i \tag{4}$$

$$E_{ij} = B_{ij} \times T_i \tag{5}$$

$$B_{ij} = \frac{\sum_{k=1}^{h} A_{ijk}}{h}. \tag{6}$$

8. The projection optical system according to claim 1 wherein a placement condition of said optical members based on a Strehl value of said signed birefringence values is expressed based on the following equations:

$$0.93 \leq S \tag{7}$$

$$S = \prod_{i=1}^{m} S_i \tag{8}$$

$$S_i = 1 - \left(\frac{2\pi}{\lambda}\right)^2 \cdot \left(\frac{\sigma^2}{2} + \frac{|X|^2}{4}\right). \tag{9}$$

9. A projection exposure apparatus comprising an exposure light source, a reticle in which a pattern original image is formed, an illumination optical system for illuminating said reticle with light emitted from said exposure light source, a projection optical system for projecting the pattern image from said reticle onto a photosensitive substrate, and an alignment system for achieving alignment between said reticle and said photosensitive substrate, wherein said projection optical system is the projection optical system as set forth in claim 1.

10. The projection exposure apparatus according to claim 9 wherein said exposure light source emits light of the wavelength of not more than 250 nm as exposure light.

11. A production method of a projection optical system comprising at least two silica glass optical members, said production method comprising:

a step of measuring a birefringence value at each of points in a plane normal to the optical axis with a center at an intersection of each optical member with the optical axis and determining a distribution of signed birefringence values in the plane normal to the optical axis, based on the birefringence values and directions of the fast axis thereof;

a step of calculating a signed birefringence characteristic value of the entire projection optical system, based on the distributions of signed birefringence values of the respective optical members; and a step of combining said optical members with each other so as to satisfy such a placement condition that said signed birefringence characteristic value of the entire projection optical system is between −0.5 and +0.5 nm/cm both inclusive.

12. The production method of the projection optical system according to claim 11, further comprising:

a step of measuring a distribution of said signed birefringence values based on effective paths of each said optical member by ray tracing;

a step of calculating a Strehl value of said signed birefringence values based on the effective paths of the entire projection optical system from the distributions of said signed birefringence values based on the effective paths of the respective optical members; and a step of combining said optical members with each other so as to satisfy such a placement condition that the Strehl value is not less than 0.93.

13. The production method of the projection optical system according to claim 11 wherein said optical members are optical members in which said signed birefringence values around said center in the plane normal to said optical axis are between −0.2 and +0.2 nm/cm both inclusive.

14. The production method of the projection optical system according to claim 11 wherein said optical members are optical members in which the distribution of the signed birefringence values in the plane normal to the optical axis has no extremum except around said center.

15. The production method of the projection optical system according to claim 11 wherein said optical members are optical members in which a difference between a maximum and a minimum of said signed birefringence values in the plane normal to said optical axis is not more than 2.0 nm/cm.

16. The production method of the projection optical system according to claim 11 wherein said optical members are optical members in which a maximum of slope of the distribution of the signed birefringence values in a radial direction in the plane normal to said optical axis is not more than 0.2 nm/cm per 10 mm of radial width.

17. The production method of the projection optical system according to claim 11 wherein the placement condition of said optical members based on the signed birefringence characteristic value of the entire projection optical system is derived based on the following equations:

$$-0.5 \leq H \leq +0.5 \text{ nm/cm} \tag{1}$$

$$H = \frac{\sum_{j=1}^{n} G_j}{n} \tag{2}$$

$$G_j = \frac{\sum_{i=1}^{m} E_{ij}}{D} \tag{3}$$

$$D = \sum_{i=1}^{m} T_i \tag{4}$$

$$E_{ij} = B_{ij} \times T_i \tag{5}$$

$$B_{ij} = \frac{\sum_{k=1}^{h} A_{ijk}}{h}. \tag{6}$$

18. The production method of the projection optical system according to claim 11 wherein a placement condition of said optical members based on a Strehl value of said signed birefringence values is derived based on the following equations:

$$0.93 \leq S \tag{7}$$

$$S = \prod_{i=1}^{m} S_i \tag{8}$$

$$S_i = 1 - \left(\frac{2\pi}{\lambda}\right)^2 \cdot \left(\frac{\sigma^2}{2} + \frac{|X|^2}{4}\right). \tag{9}$$

\* \* \* \* \*